(12) United States Patent
Yun et al.

(10) Patent No.: US 12,701,784 B2
(45) Date of Patent: Aug. 4, 2026

(54) INTEGRATED CIRCUIT DEVICES INCLUDING INTERGATE SPACER AND METHODS OF FABRICATION THE SAME

(71) Applicant: Samsung Electronics Co., Ltd., Suwon-si (KR)

(72) Inventors: Seungchan Yun, Waterford, NY (US); Jaejik Baek, Watervliet, NY (US); Kang-Ill Seo, Springfield, VA (US)

(73) Assignee: Samsung Electronics Co, Ltd., Suwon-si (KR)

( * ) Notice: Subject to any disclaimer, the term of this patent is extended or adjusted under 35 U.S.C. 154(b) by 377 days.

(21) Appl. No.: 18/460,110

(22) Filed: Sep. 1, 2023

(65) Prior Publication Data

US 2024/0371880 A1      Nov. 7, 2024

Related U.S. Application Data

(60) Provisional application No. 63/499,817, filed on May 3, 2023.

(51) Int. Cl.
| | |
|---|---|
| *H10D 84/85* | (2025.01) |
| *H10D 86/00* | (2025.01) |
| *H10D 86/01* | (2025.01) |
| H10D 84/03 | (2025.01) |
| H10D 88/00 | (2025.01) |

(52) U.S. Cl.
CPC ........... *H10D 84/85* (2025.01); *H10D 84/856* (2025.01); *H10D 86/01* (2025.01); *H10D 86/201* (2025.01); *H10D 84/038* (2025.01); *H10D 88/01* (2025.01)

(58) Field of Classification Search
CPC ..... H10D 30/0273; H10D 30/501–509; H10D 30/6735; H10D 30/674; H10D 30/6757;
H10D 62/115; H10D 62/121; H10D 64/017; H10D 84/01; H10D 84/0167; H10D 84/0177; H10D 84/0179; H10D 84/0184; H10D 84/0193; H10D 84/038; H10D 84/8311; H10D 84/8312; H10D 84/83135; H10D 84/83138; H10D 84/8314; H10D 84/8316; H10D 84/85; H10D 84/851–852; H10D 84/856; H10D 86/01; H10D 86/201; H10D 88/00; H10D 88/01; H10D 62/12
See application file for complete search history.

(56) References Cited

U.S. PATENT DOCUMENTS

| | | |
|---|---|---|
| 9,711,414 B2 | 7/2017 | Hatcher et al. |
| 9,881,998 B1 | 1/2018 | Cheng et al. |
| 10,505,007 B1 | 12/2019 | Su et al. |
| 10,825,813 B2 | 11/2020 | Liao et al. |
| 11,164,799 B2 | 11/2021 | Wu et al. |
| 11,482,612 B2 | 10/2022 | Mochizuki et al. |
| 2019/0221639 A1 | 7/2019 | Tseng et al. |
| 2020/0013682 A1 | 1/2020 | Cheng et al. |

(Continued)

*Primary Examiner* — Cheung Lee
(74) *Attorney, Agent, or Firm* — Myers Bigel, P.A.

(57) ABSTRACT

An integrated circuit device may comprise an upper transistor on a substrate. The upper transistor may comprise an upper channel region. The integrated circuit device may further comprise a lower transistor between the substrate and the upper transistor. The lower transistor may comprise a lower channel region, an intergate spacer comprising an insulating material and adjacent to a side surface of the lower channel region, and a gate layer. The intergate spacer may be between the side surface of the lower channel region and the gate layer.

18 Claims, 39 Drawing Sheets

(56)                     References Cited

U.S. PATENT DOCUMENTS

| | | |
|---|---|---|
| 2020/0294866 A1 | 9/2020 | Cheng et al. |
| 2021/0265345 A1 | 8/2021 | Xie et al. |
| 2021/0320035 A1 | 10/2021 | Xie et al. |
| 2021/0349691 A1 | 11/2021 | Hekmatshoartabari et al. |
| 2021/0407999 A1 | 12/2021 | Huang et al. |
| 2022/0109046 A1 | 4/2022 | Hong et al. |
| 2022/0216322 A1 | 7/2022 | Lin et al. |
| 2023/0055047 A1 | 2/2023 | Xie et al. |
| 2023/0068484 A1 | 3/2023 | Bao et al. |

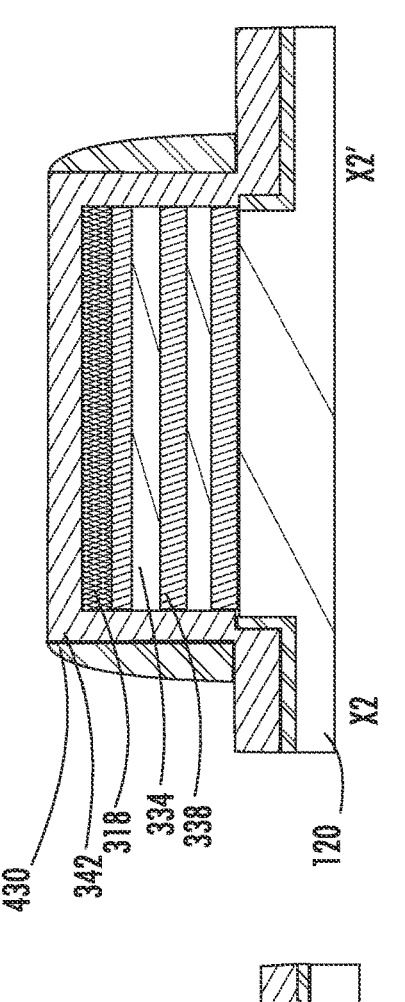
FIG. 4B
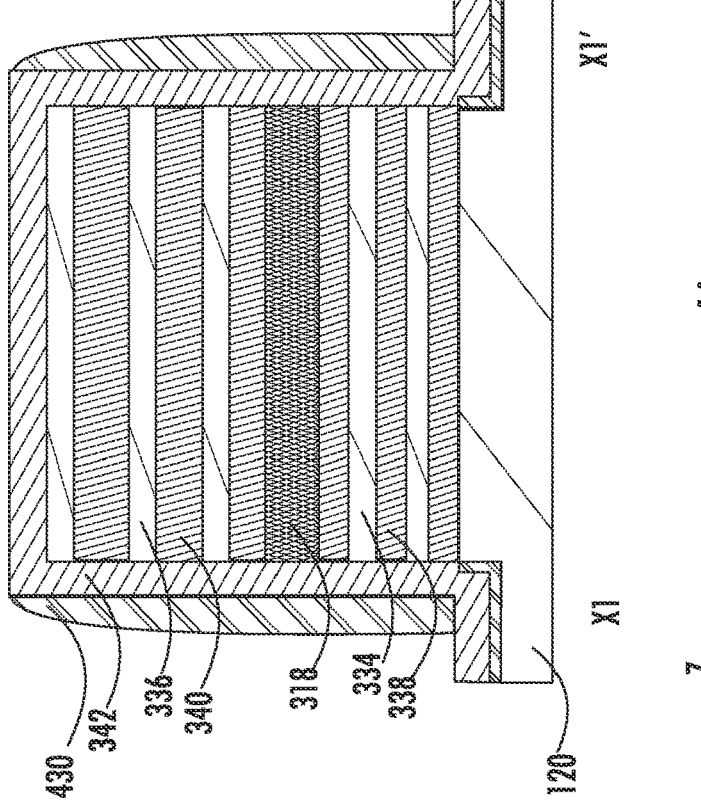
FIG. 4A
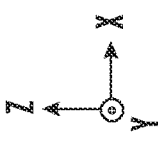

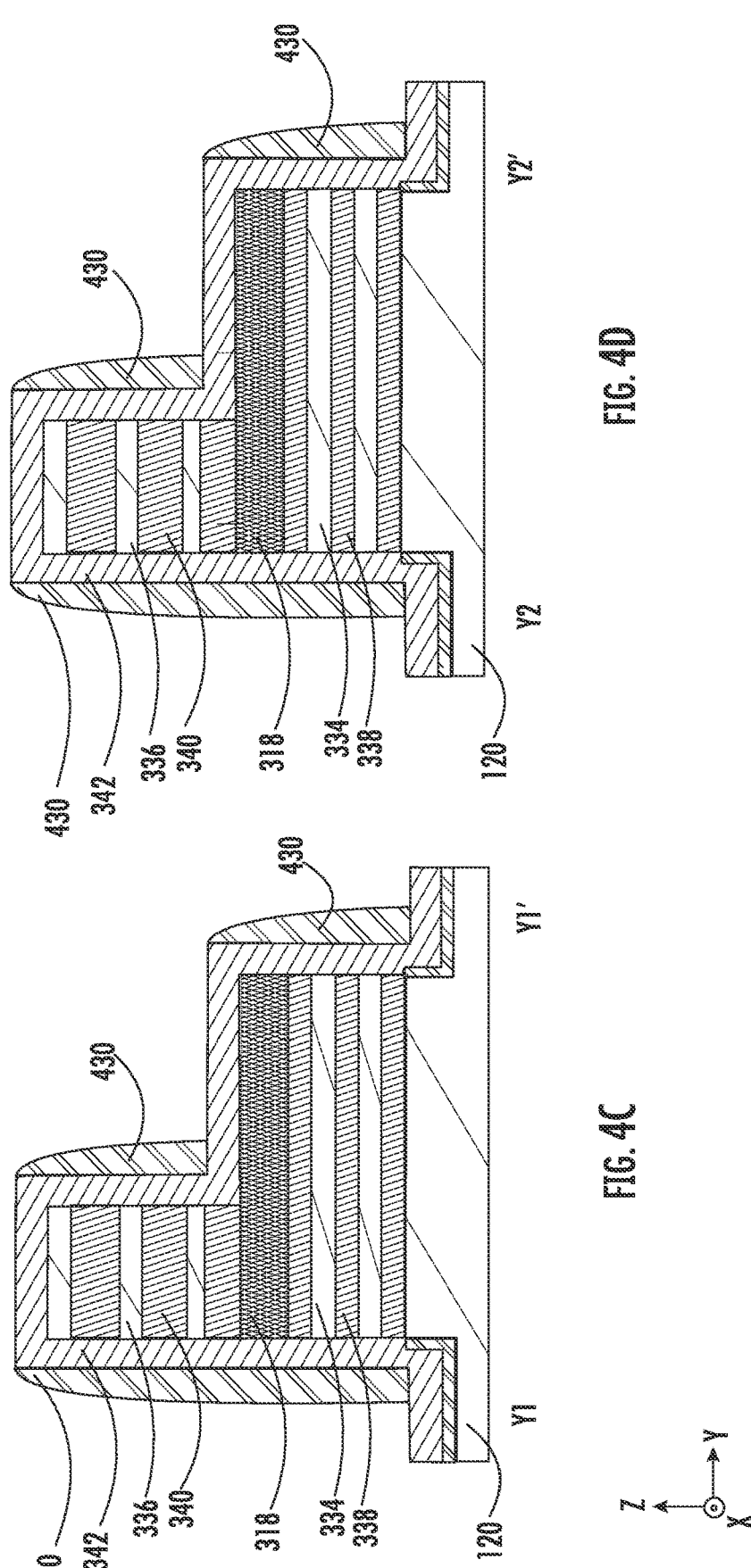

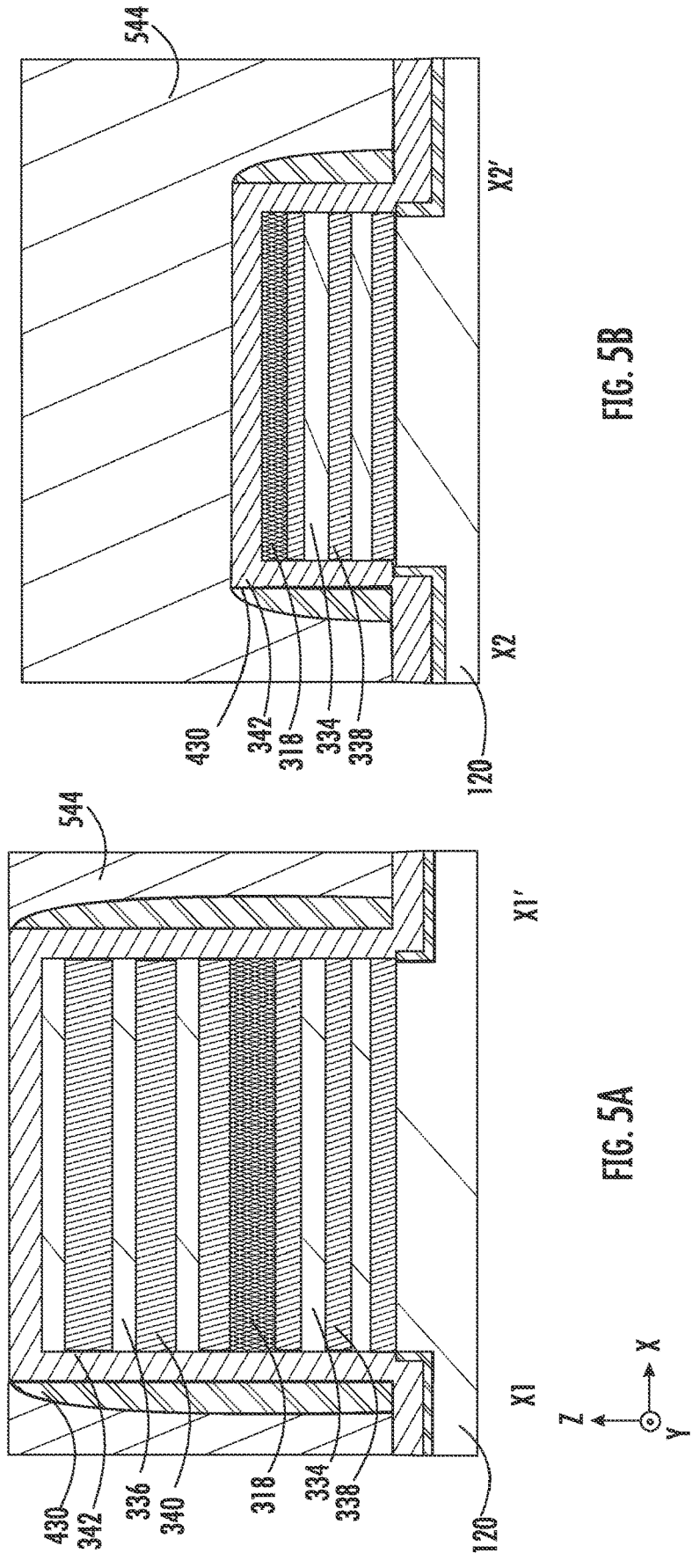

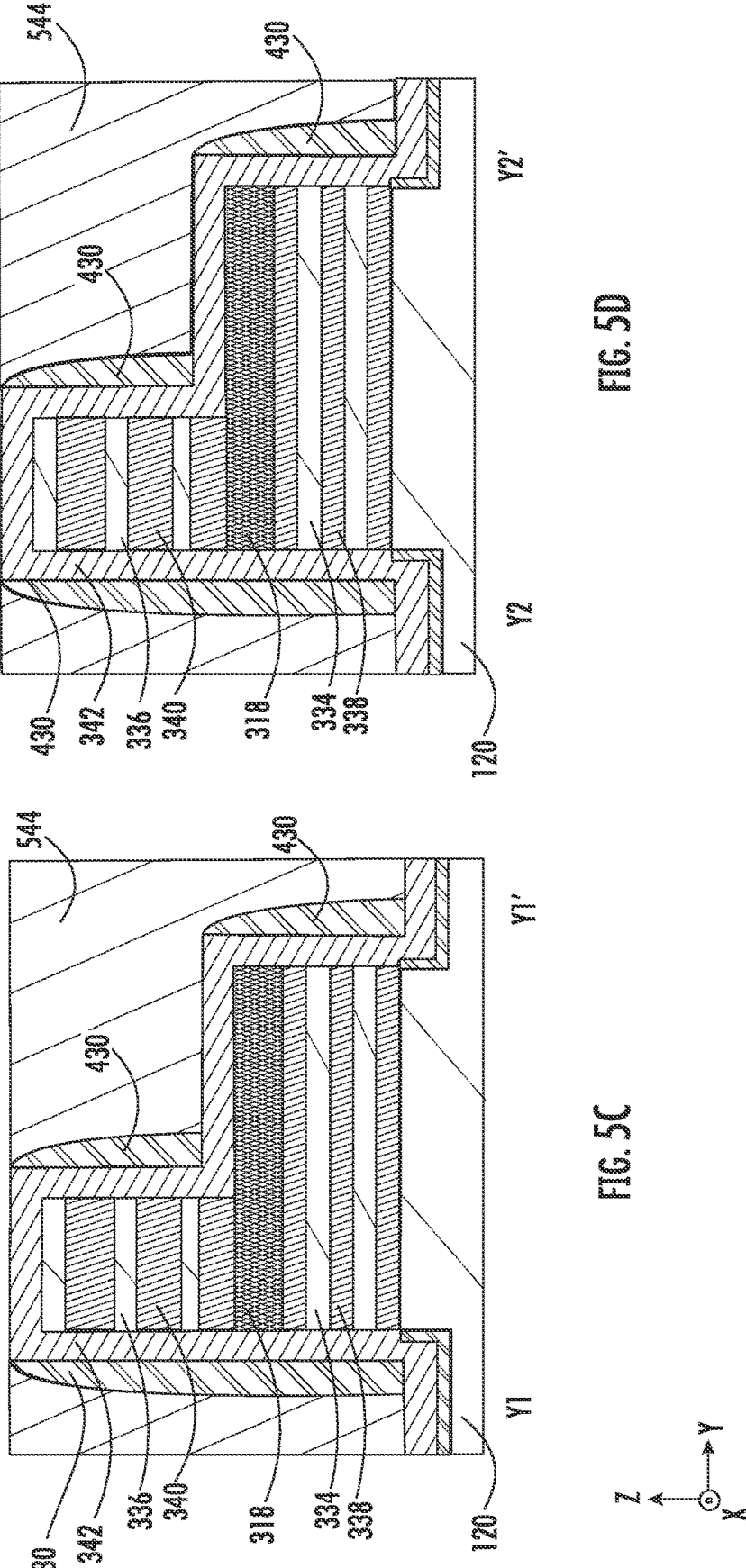

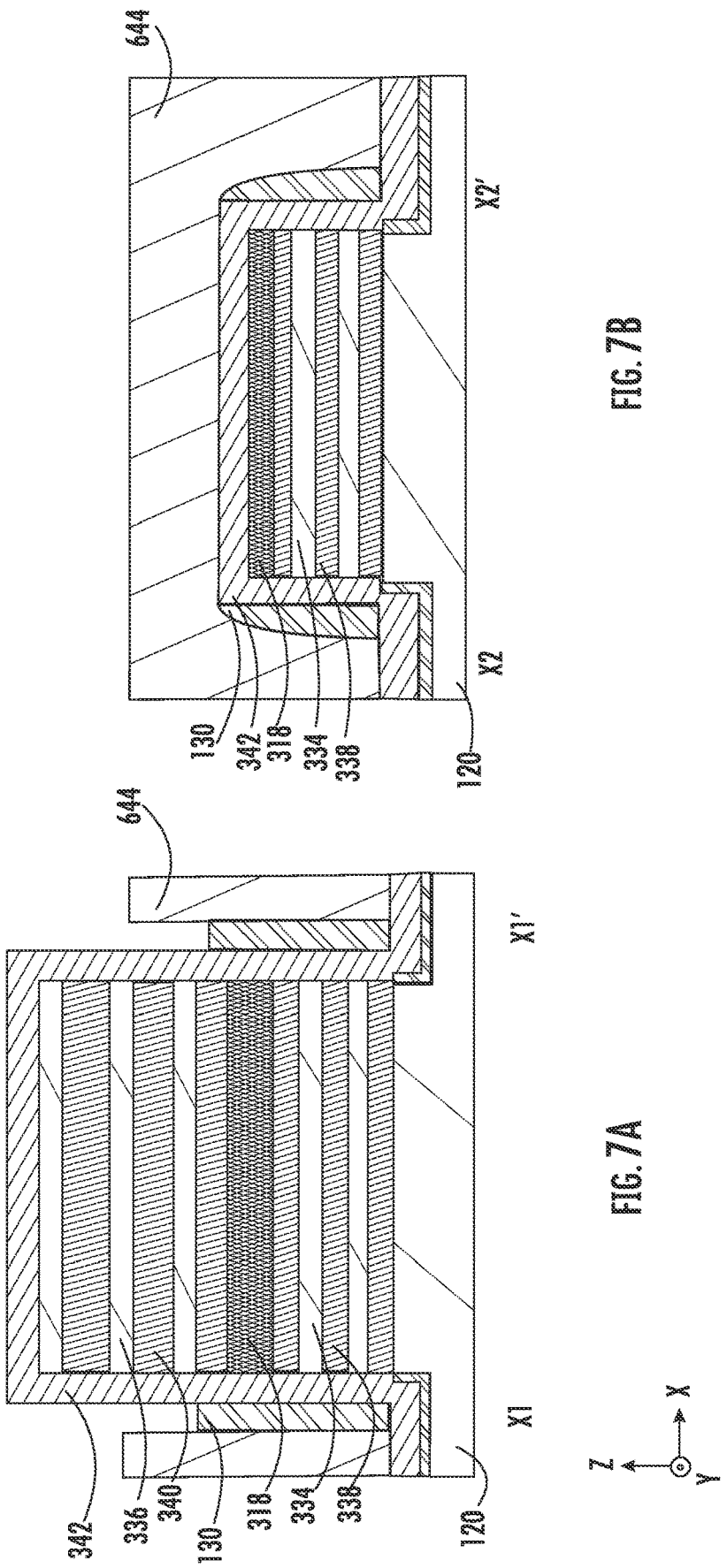

INTEGRATED CIRCUIT DEVICES INCLUDING INTERGATE SPACER AND METHODS OF FABRICATION THE SAME

CLAIM OF PRIORITY

The present application claims the benefit of U.S. Provisional Patent Application Ser. No. 63/499,817, filed on May 3, 2023, entitled DEVICES INCLUDING STACKED FIELD-EFFECT TRANSISTOR AND METHODS OF FORMING THE SAME, the disclosure of which is hereby incorporated herein in its entirety by reference.

BACKGROUND

The present disclosure generally relates to the field of integrated circuit devices and, more particularly, to integrated circuit devices including stacked transistors.

Various structures of an integrated circuit device and methods of forming the same have been proposed to increase the integration density. For example, a stacked transistor structure including multiple transistors vertically stacked has been proposed.

SUMMARY

An integrated circuit device comprising: an upper transistor on a substrate, the upper transistor comprising an upper channel region; a lower transistor between the substrate and the upper transistor, the lower transistor comprising a lower channel region; an intergate spacer comprising an insulating material and adjacent to a side surface of the lower channel region; and a gate layer, wherein the intergate spacer is between the side surface of the lower channel region and the gate layer.

An integrated circuit device comprising: an upper transistor on a substrate, the upper transistor comprising an upper channel region; a lower transistor between the substrate and the upper transistor, the lower transistor comprising a lower channel region and a lower work function layer on the lower channel region; an intergate spacer comprising an insulating material, wherein the lower work function layer is between the lower channel region and the intergate spacer; and a gate layer on the intergate spacer.

A method of forming an integrated circuit device, the method comprising: forming a lower stack and an upper stack on a substrate, wherein the lower stack is between the substrate and the upper stack, the lower stack comprises a lower sacrificial pattern and a lower channel region stacked in a vertical direction, and the upper stack comprises an upper sacrificial pattern and an upper channel region stacked in the vertical direction; forming a dummy gate insulator on the lower stack and the upper stack; forming an intergate spacer adjacent to a side surface of the lower stack; removing the dummy gate insulator, the lower sacrificial pattern and the upper sacrificial pattern, thereby exposing the lower channel region and the upper channel region and forming a cavity between the lower channel region and the intergate spacer; forming a gate insulator on the lower channel region and the upper channel region;

forming a lower work function layer on the gate insulator and in the cavity between the lower channel region and the intergate spacer; forming an upper work function layer on the lower work function layer and the intergate spacer; and forming an upper gate layer on the upper work function layer.

BRIEF DESCRIPTION OF THE DRAWINGS

FIGS. 3A, 3B, 3C, 3D, 4A, 4B, 4C, 4D, 5A, 5B, 5C, 5D, 6A, 6B, 6C, 6D, 7A, 7B, 7C, 7D, 8A. 8B. 8C. 8D, 9A, 9B. 9C, 9D, 10A, 10B, 10C. 10D, 11A, 11B, 11C, 11D, 12A, 12B, 12C, 12D, 13A, 13B, 13C, 13D, 14A, 14B, 14C, 14D, 15A, 15B, 15C, 15D, 16A, 16B, 16C and 16D are cross-sectional views illustrating methods of forming an integrated circuit device according to some embodiments.

DETAILED DESCRIPTION

Pursuant to embodiments herein, an integrated circuit device may include a stacked transistor structure including a lower transistor on a substrate and an upper transistor vertically stacked on the lower transistor. The upper transistor may include a plurality of upper channel regions, and the lower transistor may include a plurality of lower channel regions.

Processes of forming a lower work function layer between the lower channel regions may include forming a preliminary work function layer on the lower channel regions and the upper channel regions and removing an upper portion of the preliminary work function layer formed on the upper channel regions. The remaining lower portion of the preliminary work function layer on the lower channel regions may be the lower work function layer. While removing the upper portion of the preliminary work function layer formed on the upper channel regions, the preliminary work function layer between the lower channel regions may be partially and inwardly etched and form recessed or pinched-off regions. During the subsequent upper work function layer formation process, the recessed or pinched-off regions may be deposited by the upper work function layer so that the performance of the lower transistor may be degraded. To improve the performance of the lower transistor, the recessed or pinched-off regions should be reduced.

Example embodiments will be described in greater detail with reference to the attached figures.

Figure 1:
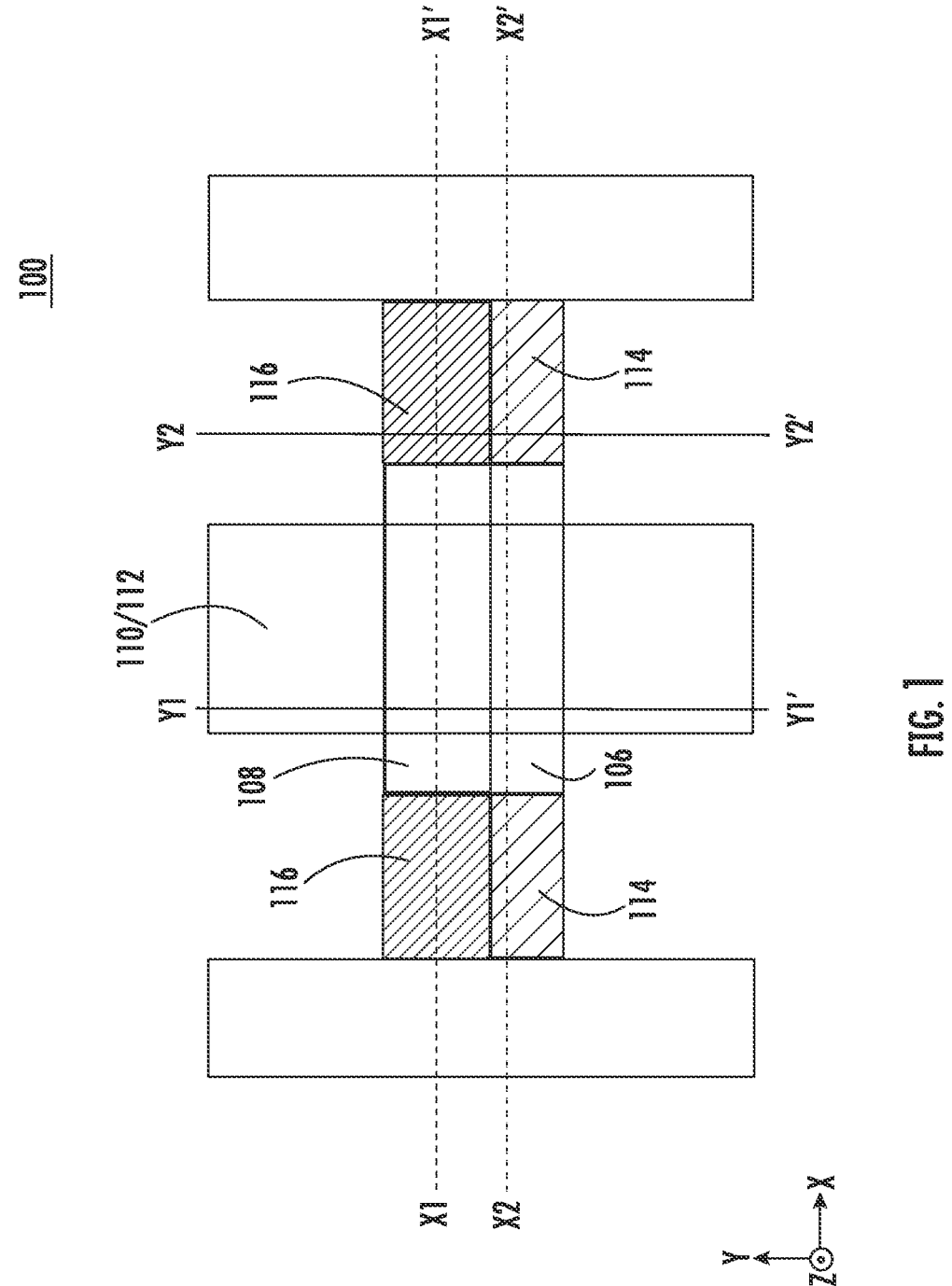
FIG. 1 is a plan view of an integrated circuit device according to some embodiments.
Figures 1A, 1B:
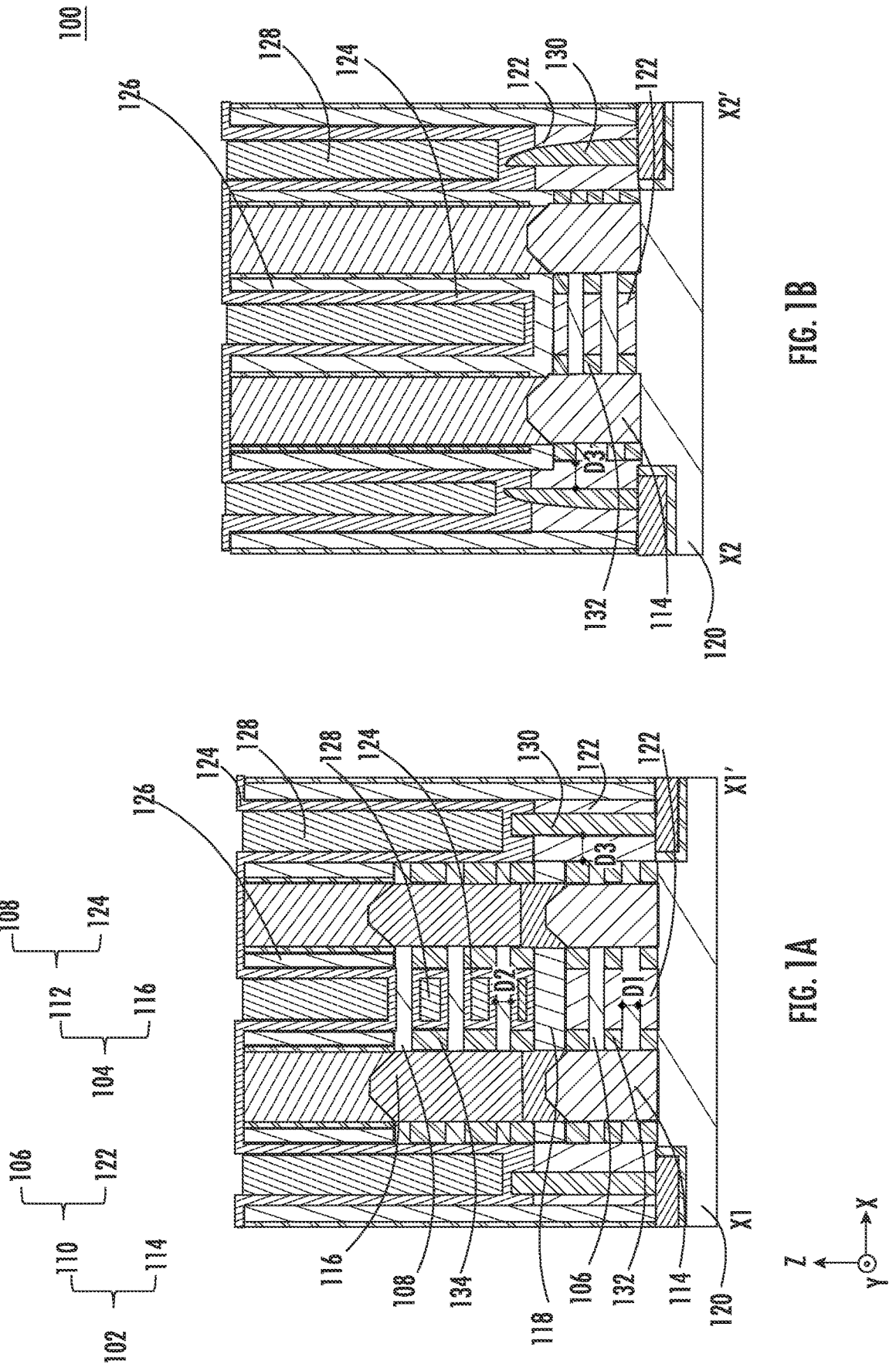
FIGS. 1A, 1B, 1C and 1D are example cross-sectional views of the integrated circuit device of FIG. 1 according to some embodiments.
Figure 1D:
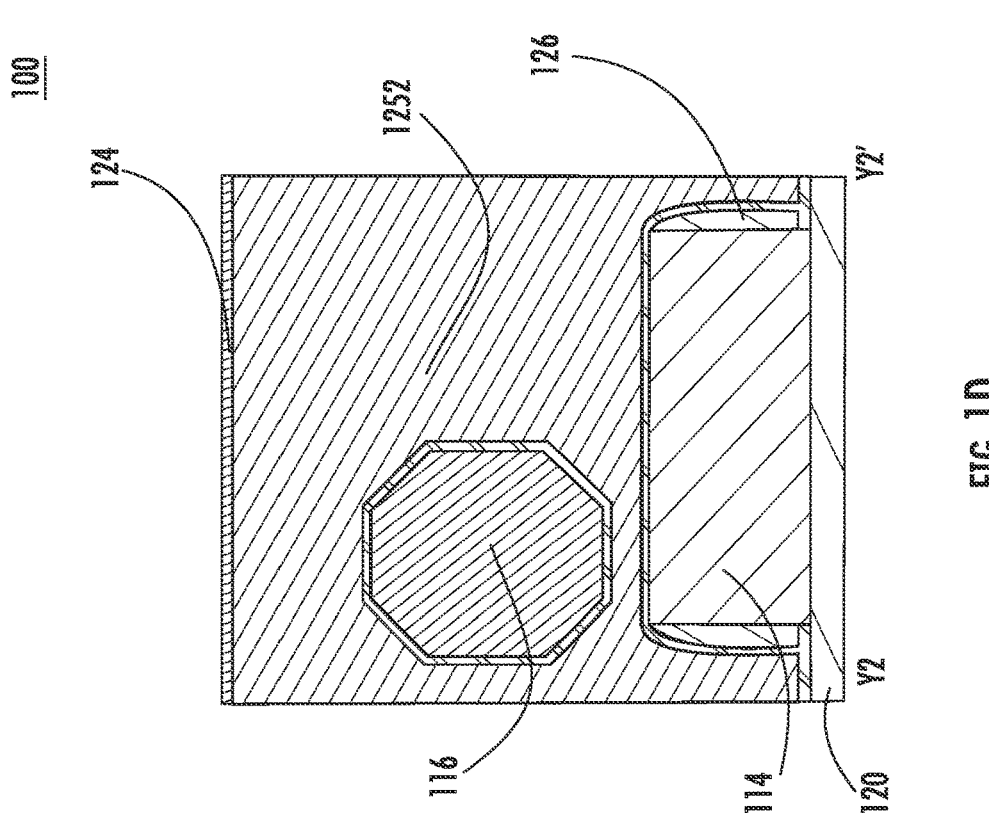
Figure 1C:
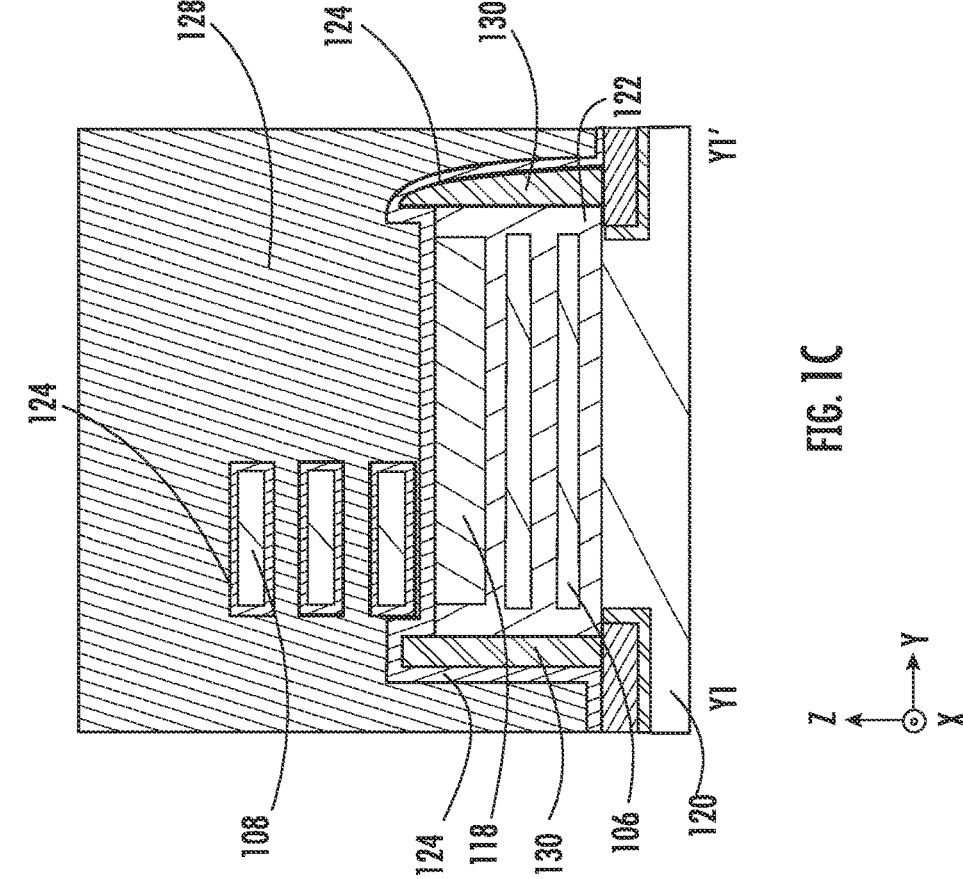

FIG. 1 is a plan view of an integrated circuit device 100 according to some embodiments. FIG. 1A is a cross-sectional view of the integrated circuit device 100 taken along line X1-X1' in FIG. 1 according to some embodiments. FIG. 1B is a cross-sectional view of the integrated circuit device 100 taken along line X2-X2' in FIG. 1 according to some embodiments. FIG. 1C is a cross-sectional view of the integrated circuit device 100 taken along line Y1-Y1' in FIG. 1 according to some embodiments. FIG. 1D is a cross-sectional view of the integrated circuit device 100 taken along line Y2-Y2' in FIG. 1 according to some embodiments. Referring to FIGS. 1, 1A, 1B, 1C, and 1D, the integrated circuit device 100 may include a substrate 120, a lower transistor 102 on the substrate 120, an upper transistor 104 on the lower transistor 102. The lower transistor 102 may be between the substrate 120 and the upper transistor 104. The lower transistor 102 may include a lower channel region 106. The upper transistor 104 may include an upper channel region 108. The upper and lower channel regions 108 and 106 may include, for example, a semiconductor material such as silicon (Si). For simplicity of illustration, only one lower transistor 102 and one upper transistor 104 are shown in FIGS. 1, 1A, 1B, 1C, and 1D. In some embodiments, however, the integrated circuit device 100 may include multiple upper transistors and lower transistors.

The integrated circuit device 100 may further include an integrated insulator 118 between the lower transistor 102 and the upper transistor 104 (e.g., between the lower channel region 106 and the upper channel region 108) in a Z-direction (also referred to a vertical direction or a third direction). The integrated insulator (e.g., the integrated insulator 118) may be also referred to as an intergate insulator. The integrated insulator 118 may include multiple layers. For example, the integrated insulator 118 may include silicon nitride (SiN), siliconboron carbonitride (SiBCN), and/or silicon oxycarbonitride (SiOCN), but is not limited thereto. The substrate 120 may include an upper surface facing the lower channel region 106, and the Z-direction may be perpendicular to the upper surface of the substrate 120.

The upper channel region 108 may include a plurality of upper channel regions 108 stacked in the Z-direction. The upper channel regions 108 may be spaced apart from each other in the Z-direction. The upper transistor 104 may further include an upper source/drain region 116 that is electrically connected to and/or is in contact with the upper channel regions 108. The upper channel regions 108 may be disposed between a pair of the upper source/drain regions 116 that are spaced apart from each other in a X-direction (also referred to as a first horizontal direction or a first direction). The X-direction may be parallel to the upper surface of the substrate 120 and may be perpendicular to the Z-direction.

Likewise, the lower channel region 106 may include a plurality of lower channel regions 106 stacked in the Z-direction. The lower channel regions 106 may be spaced apart from each other in the Z-direction. The lower transistor 102 may further include a lower source/drain region 114 that is electrically connected to and/or is in contact with the lower channel regions 106. The lower channel regions 106 may be disposed between a pair of the lower source/drain regions 114 that are spaced apart from each other in the X-direction. Each of the upper channel region 108 and the lower channel region 106 may include, for example, semiconductor material(s) (e.g., Si, Ge, SiGe, GaP, GaAs, SiC, SiGeC, and/or InP). Each of the upper channel regions 108 and the lower channel regions 106 may be, for example, a nanosheet that may have a thickness in a range of from 1 nm to 100 nm in the Z-direction or may be a nanowire that may have a circular cross-section with a diameter in a range of from 1 nm to 100 nm. However, the thicknesses or the diameters of the upper channel regions 108 and the lower channel regions 106 may not limit the present inventive concept.

In some embodiments, the upper source/drain region 116 may include a different semiconductor material from that of the lower source/drain region 114. For example, the upper source/drain region 116 may include silicon germanium (SiGe), and the lower source/drain region 114 may include silicon (Si).

The upper transistor 104 may further include an upper gate structure 112 on the upper channel regions 108. The upper gate structure 112 may include a portion of a gate layer 128 (e.g., an upper portion of the gate layer 128) and an upper work function layer 124. Further, the upper gate structure 112 may include an upper gate insulator that extends between the upper channel region 108 and the upper work function layer 124 to separate the upper channel region 108 and the upper work function layer 124 from each other.

The upper work function layer 124 may be disposed on the upper channel region 108. For example, a portion of the upper work function layer 124 may be disposed in a space between two adjacent upper channel regions 108. In some embodiments, a portion of the gate layer 128 (e.g., an upper portion of the gate layer 128) may be disposed in the space between two adjacent upper channel regions 108. For example, in a cross-sectional view, the portion of the upper work function layer 124 may extend around the portion of the gate layer 128 (e.g., an upper portion of the gate layer 128) in the space between two adjacent upper channel regions 108.

Likewise, the lower transistor 102 may further include a lower gate structure 110 on the lower channel regions 106. The lower gate structure 110 may include a portion of the gate layer 128 (e.g., a lower portion of the gate layer 128) and a lower work function layer 122. Further, the lower gate structure 110 may include a lower gate insulator that extends between the lower channel region 106 and the lower work function layer 122 to separate the lower channel region 106 and the lower work function layer 122 from each other.

The lower work function layer 122 may be disposed on the lower channel region 106. For example, a portion of the lower work function layer 122 may be disposed in a space between two adjacent lower channel regions 106. In some embodiments, a portion of the gate layer 128 (e.g., a lower portion of the gate layer 128) may be disposed in the space between two adjacent lower channel regions 106. For example, in a cross-sectional view, the portion of the lower work function layer 122 may extend around the portion of the gate layer 128 (e.g., a lower portion of the gate layer 128) in the space between two adjacent lower channel regions 106. However, the embodiments of the present inventive concept are not limited thereto. For example, referring to FIGS. 1A through 1D, the lower work function layer 122 may fill the space between two adjacent lower channel regions 106 without the gate layer 128 (e.g., without a lower portion of the gate layer 128).

The gate layer 128 (e.g., each of the upper and lower portions of the gate layer 128) may include, for example, tungsten (W), aluminum (Al) and/or copper (Cu). In some embodiments, the upper and lower portions of the gate layer 128 may comprise an integrated unitary structure. According to some embodiments, the upper and lower portions of the gate layer 128 may comprise an upper gate layer (referring to upper gate layer 1728b in FIGS. 17A and 17B) and a lower gate layer (referring to lower gate layer 1728a in FIGS. 17A and 17B), respectively.

In some embodiments, the upper transistor 104 and the lower transistor 102 may have different conductivity types. In some embodiments, the upper transistor 104 may be a p-type transistor, and the upper work function layer 124 may include a p-type work function layer (e.g., TiN layer). In some embodiments, the lower transistor 102 may be an n-type transistor, and the lower work function layer 122 may include an n-type work function layer (e.g., TiC layer, TiAl layer and/or TiAlC layer). Each of the lower work function layer 122 and the upper work function layer 124 may be a single layer or may include multiple layers. The integrated insulator 118 may be disposed between the upper work function layer 124 and the lower work function layer 122.

In some embodiments, two adjacent lower channel regions 106 may be spaced apart from each other by a first distance D1 in the vertical direction. In some embodiments, two adjacent upper channel regions 108 may be spaced apart from each other by a second distance D2 in the vertical direction. The second distance D2 may be longer than the first distance D1. For example, the first distance D1 may be in a range of from 3 nanometers (nm) to 12 nm (e.g., about 8 nm), and the second distance D2 may be in a range of from 10 nm to 20 nm (e.g., about 15 nm).

The integrated circuit device 100 may further include an intergate spacer 130 adjacent to the lower transistor 102. In some embodiments, the intergate spacer 130 may be adjacent to a side surface of the lower channel region 106. For example, the intergate spacer 130 may be spaced apart from a side surface of the lower channel region 106 by a third distance D3 in the X-direction and/or Y-direction (also referred to as a second horizontal direction or a second direction). In some embodiments, the Y-direction may be parallel to the upper surface of the substrate 120 and may be perpendicular to the X-direction and/or the Z-direction. The third distance D3 may be equal to or longer than the first distance D1.

In some embodiments, the intergate spacer 130 may be disposed (e.g., may extend) between a side surface of the lower channel region 106 and the lower gate structure 110 (e.g., a lower portion of the gate layer 128 and/or lower work function layer 122). For example, the intergate spacer 130 may be disposed (e.g., may extend) between the side surface of the lower channel region 106 and the lower work function layer 122. In some embodiments, the intergate spacer 130 may be disposed between the side surface of the lower channel region 106 and the gate layer 128 (e.g., a lower portion of the gate layer 128, referring to lower gate layer 1728a in FIGS. 17A and 17B).

Figures 17A, 17B:
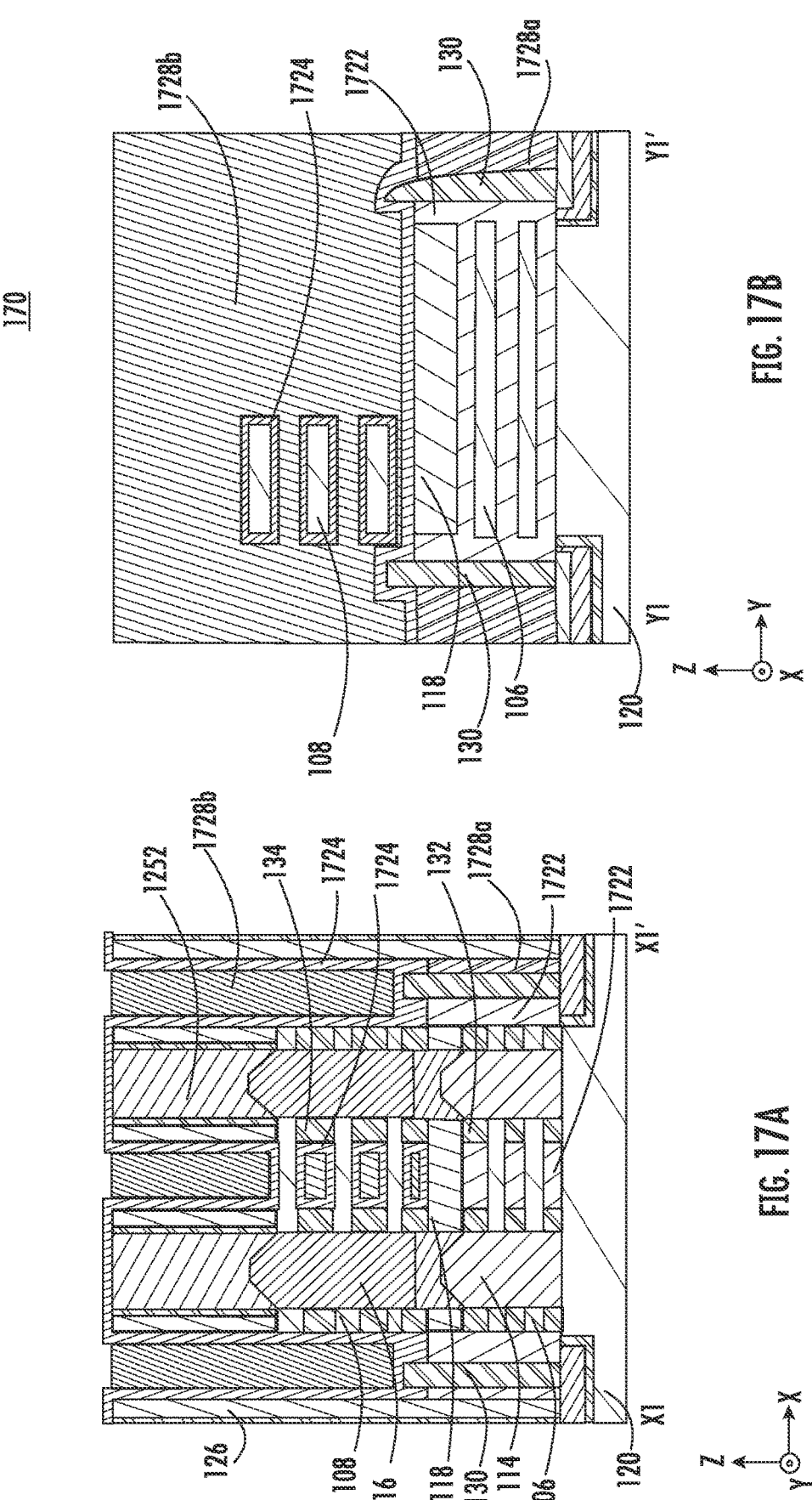
FIGS. 17A and 17B are cross-sectional views of an integrated circuit device according to some embodiments.

In some embodiments, the gate layer 128 (e.g., a lower portion of the gate layer 128, referring to lower gate layer 1728a in FIGS. 17A and 17B) may be disposed on the intergate spacer 130. In some embodiments, the intergate spacer 130 may extend between the lower work function layer 122 and the gate layer 128 (e.g., a lower portion of the gate layer 128, referring to lower gate layer 1728a in FIGS. 17A and 17B). In some embodiments, opposing side surfaces of the intergate spacer 130 may be in contact with the lower work function layer 122 and the gate layer 128 (e.g., a lower portion of the gate layer 128, referring to lower gate layer 1728a in FIGS. 17A and 17B), respectively. In some embodiments, the lower work function layer 122 may be in contact with the lower channel region 106 and the intergate spacer 130.

Referring to FIG. 1C, a lower surface of the upper channel region 108 (e.g., a lower surface of the lower most upper channel region 108) may be closer than an upper surface of the intergate spacer 130 to the substrate 120 in the Z-direction. In some embodiments, the intergate spacer 130 may comprise opposing side surfaces that contact the lower work function layer 122 and the upper work function layer 124, respectively.

Figures 18A, 18B:
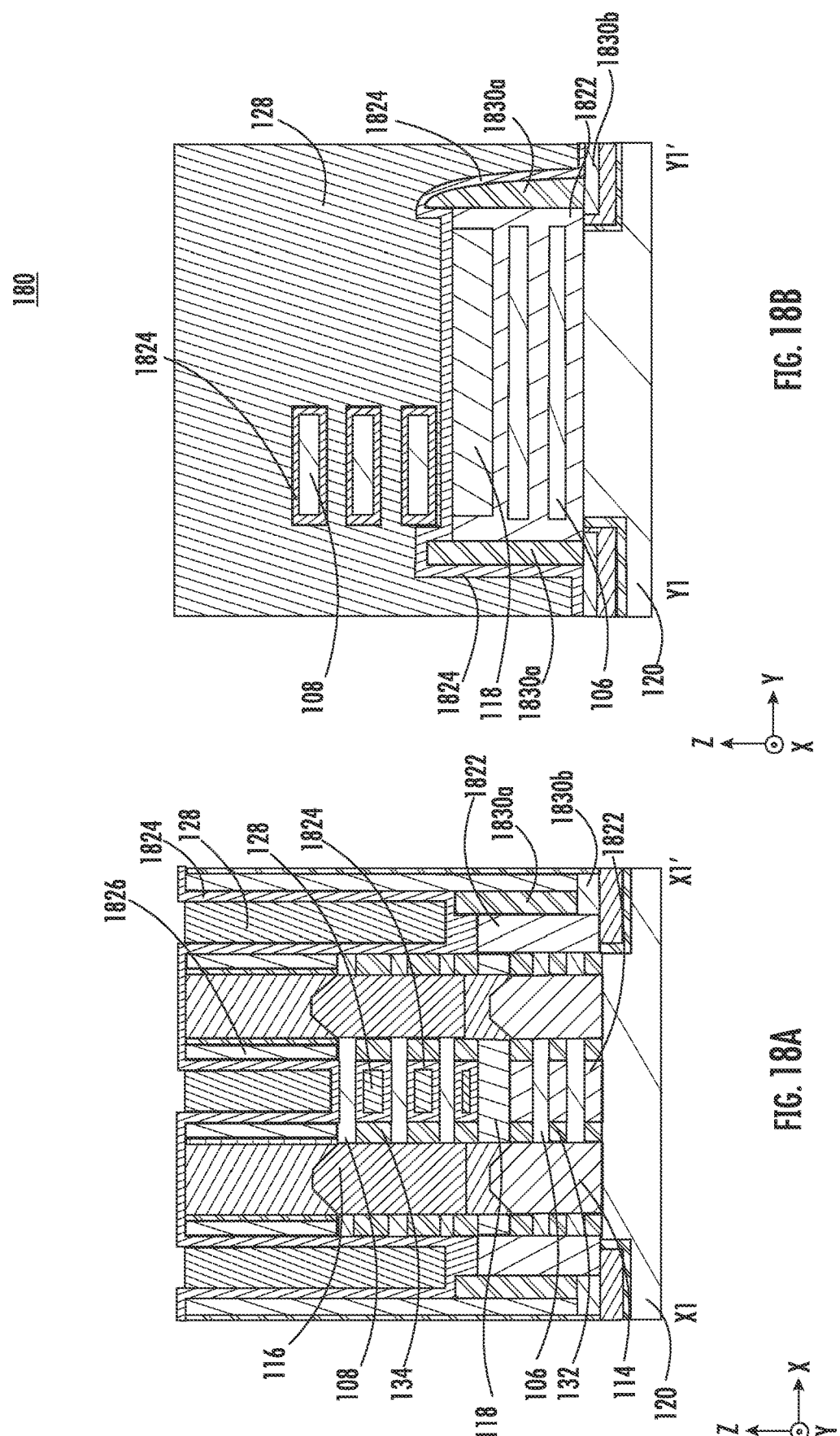
FIGS. 18A and 18B are cross-sectional views of an integrated circuit device according to some embodiments.
Figure 19:
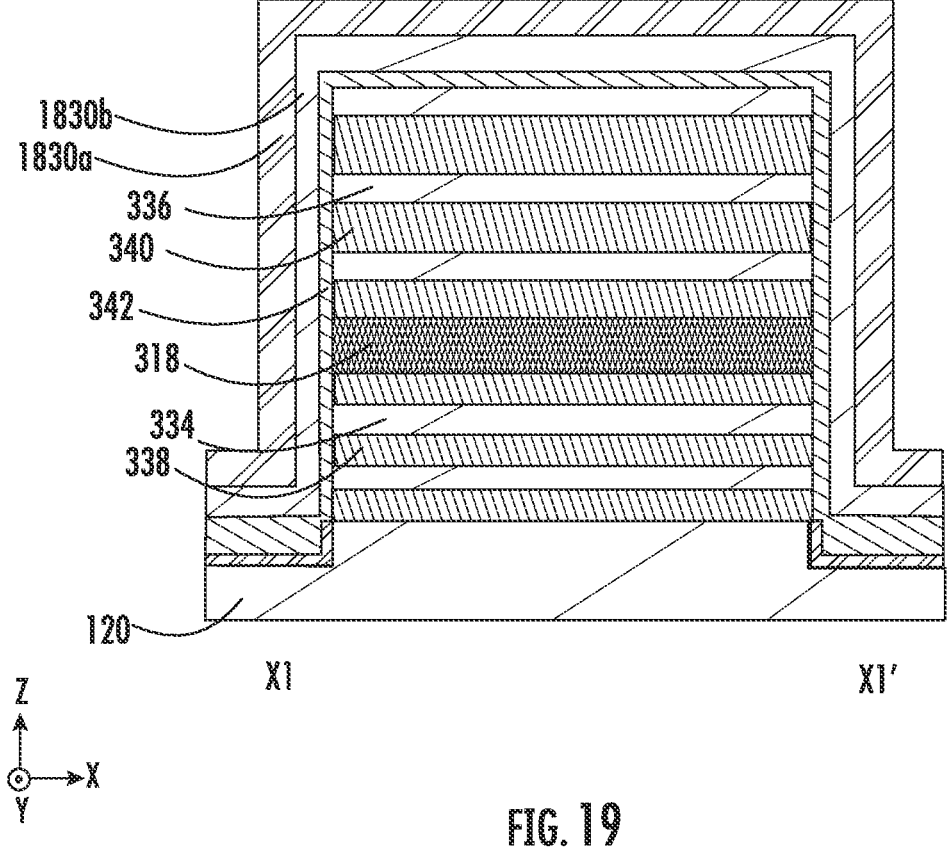
FIGS. 19 through 22 are cross-sectional views illustrating methods of forming the integrated circuit device 180 in FIG. 18A according to some embodiments.
Figure 20:
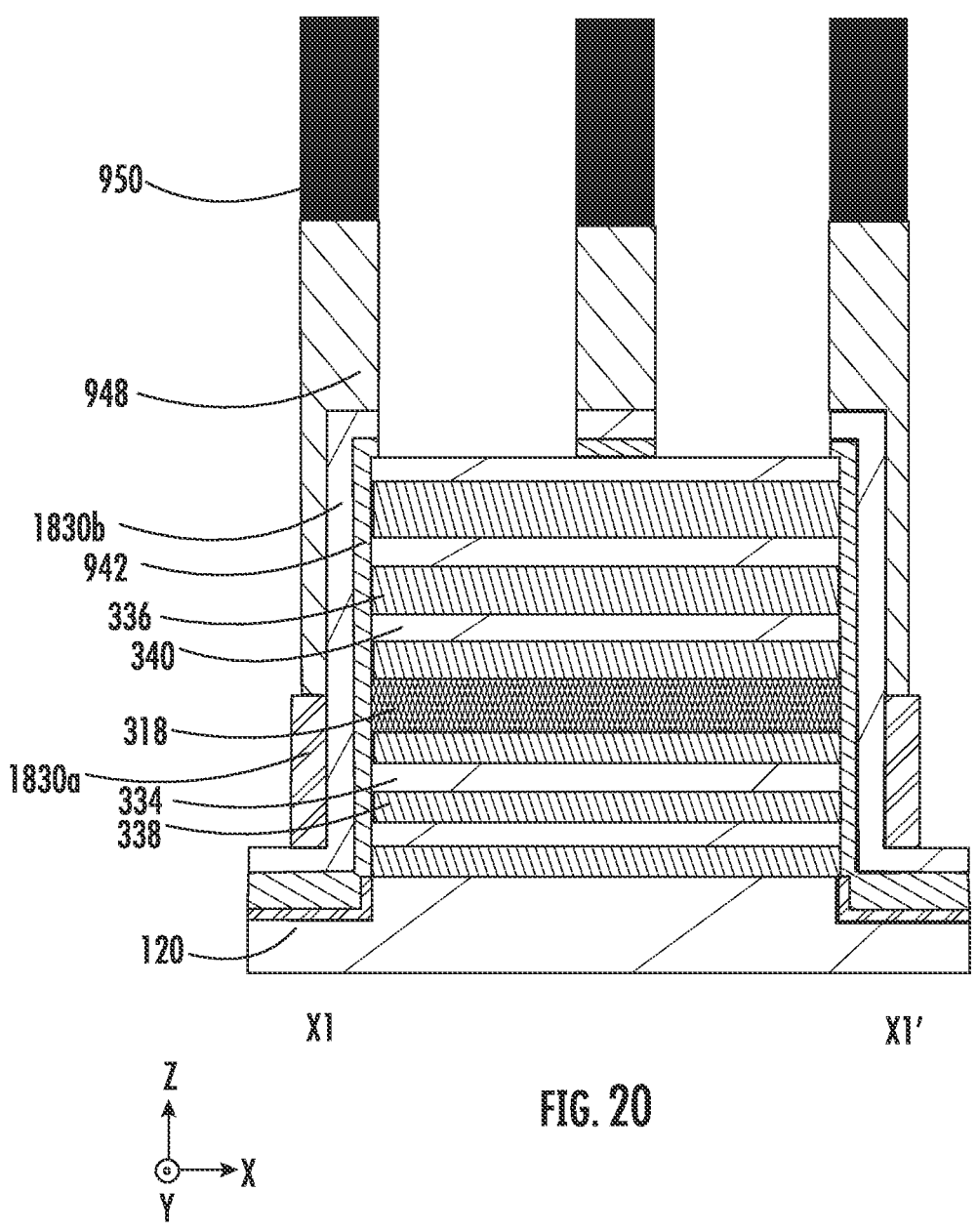
Figure 21:
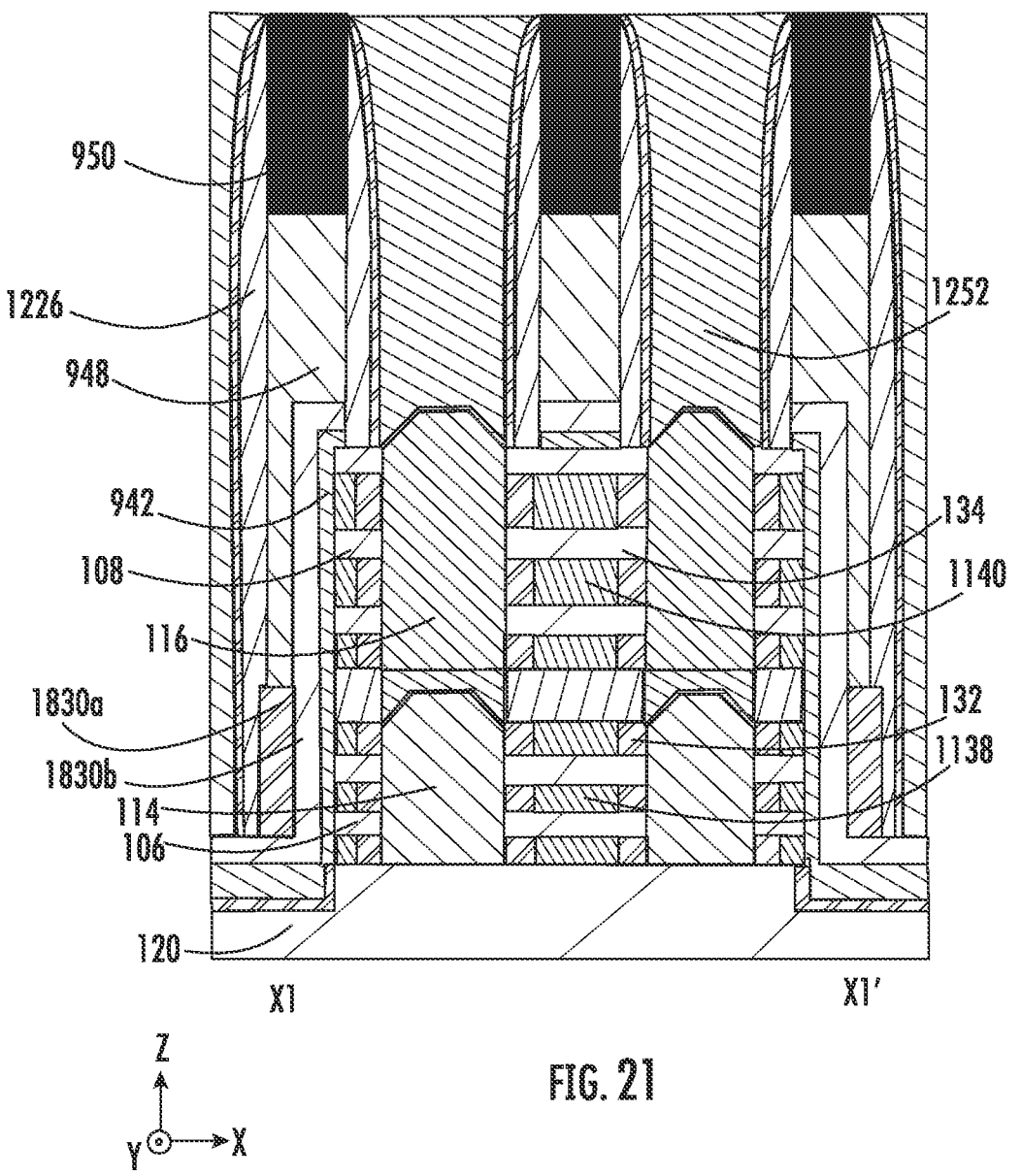
Figure 22:
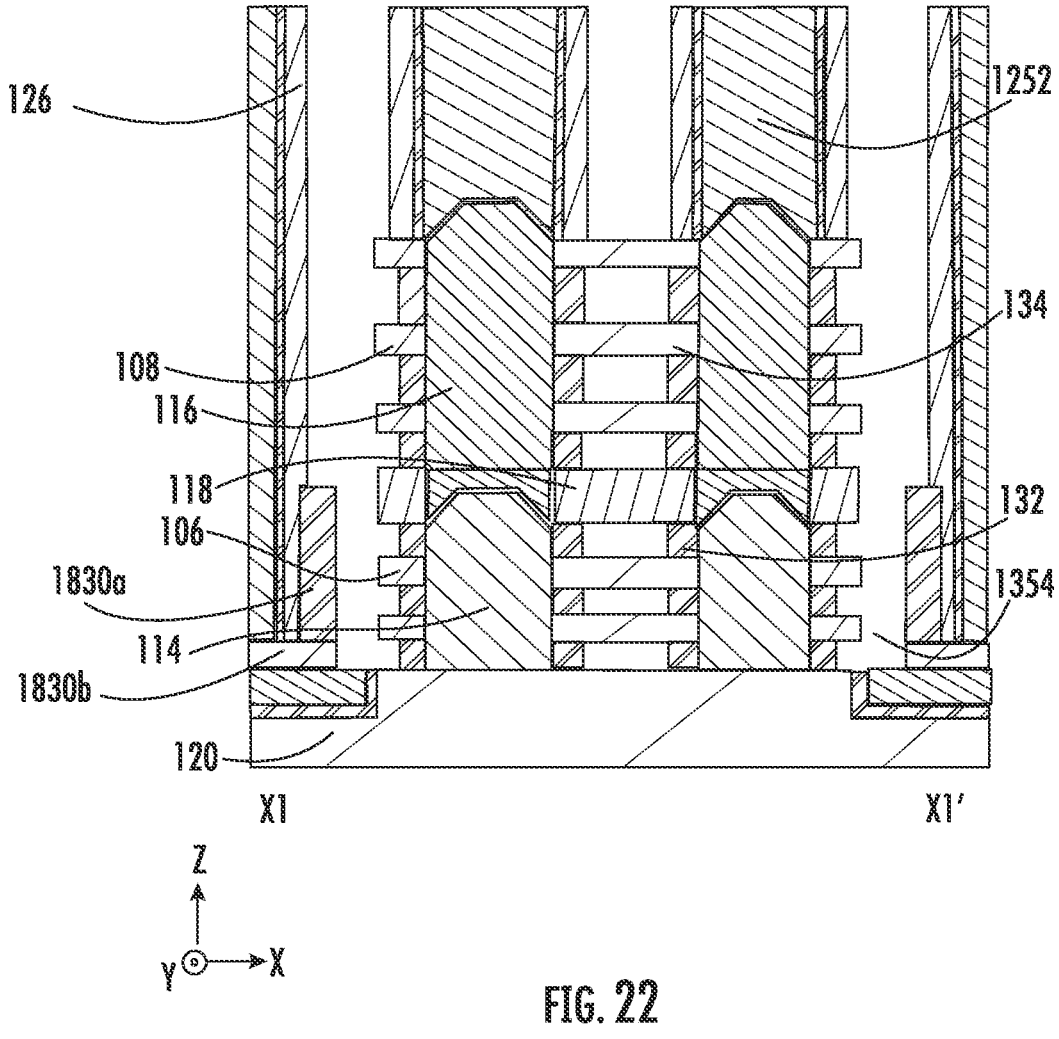

In some embodiments, the intergate spacer 130 may be a single layer or may comprise multiple layers (referring to a first sub-intergate spacer 1830a and a second sub-intergate spacer 1830b in FIGS. 18A and 18B) having different materials. The intergate spacer 130 may include, for example, an insulating material, such as silicon nitride (e.g., SiN), and/or a semiconductor material, such as poly-silicon.

The upper transistor 104 may further include an upper inner spacer layer 134. The upper inner spacer layer 134 may be disposed between the upper source/drain region 116 and the upper gate structure 112, which are spaced apart from each other in the X-direction. In addition, the upper inner spacer layer 134 may be disposed between the upper channel regions 108, which are spaced apart from each other in the Z-direction.

Likewise, the lower transistor 102 may further include a lower inner spacer layer 132. The lower inner spacer layer 132 may be disposed between the lower source/drain region 114 and the lower gate structure 110, which are spaced apart from each other in the X-direction. In addition, the lower inner spacer layer 132 may be disposed between the lower channel regions 106, which are spaced apart from each other in the Z-direction.

As shown in FIG. 1A, a side surface of the upper inner spacer layer 134 may be in contact with the upper source/drain region 116. Likewise, a side surface of the lower inner spacer layer 132 may be in contact with the lower source/drain region 114.

The upper inner spacer layer 134 may include, for example, silicon nitride (SiN). The upper inner spacer layer 134 (e.g., a lower surface of the upper inner spacer layer 134) may be in contact with the integrated insulator 118 (e.g., an upper surface of the integrated insulator 118).

Likewise, the lower inner spacer layer 132 may include, for example, silicon nitride (SiN). The lower inner spacer layer 132 (e.g., an upper surface of the lower inner spacer layer 132) may be in contact with the integrated insulator 118 (e.g., a lower surface of the integrated insulator 118).

According to some embodiments, the integrated circuit device 100 may further include a gate spacer 126 on a side surface of the upper gate structure 112 of the upper transistor 104. For example, the gate spacer 126 may be on a side surface of the upper work function layer 124. The gate spacer 126 may be on a side surface of the upper portion of the gate layer 128 (e.g., referring to an upper gate layer 1728b in FIGS. 17A and 17B). The gate spacer 126 may be in contact with the upper gate structure 112. For example, the gate spacer 126 may be in contact with a side surface of the upper work function layer 124. According to some embodiments, the gate spacer 126 may include, for example, SiBCN and/or SiOCN.

Likewise, the gate spacer 126 may be on a side surface of the lower gate structure 110 of the lower transistor 102. For example, the gate spacer 126 may be on a side surface of the lower work function layer 122. The gate spacer 126 may be on a side surface of the lower portion of the gate layer 128 (e.g., referring to a lower gate layer 1728a in FIGS. 17A and 17B). The gate spacer 126 may be in contact with the lower gate structure 110. For example, the gate spacer 126 may be in contact with a side surface of the lower work function layer 122 and/or lower portion of the gate layer 128.

Referring to FIG. 1, in a plan view, the size of the upper channel region 108 may be smaller than that of the lower channel region 106. For example, the length of the upper channel region 108 in the Y-direction may be shorter than the length of the lower channel region 106 in the Y-direction. The length of the upper channel region 108 in the X-direction may be the same as the length of the lower channel region 106 in the X-direction. In a cross-sectional view, referring to FIG. 1C, the upper channel region 108 and the lower channel region 106 may comprise an L-shape.

Referring to FIG. 1C, a first portion of the intergate spacer 130 and a second portion of the intergate spacer 130 may be spaced apart from each other in the Y-direction. The first portion of the intergate spacer 130 may be closer to the upper channel region 108 in the Y-direction. The second portion of the intergate spacer 130 may be farther from the upper channel region 108 in the Y-direction. The first portion of the intergate spacer 130 may have a flat or substantially flat upper surface. The second portion of the intergate spacer 130 may have, for example, a curved or rounded upper surface.

Figure 2:
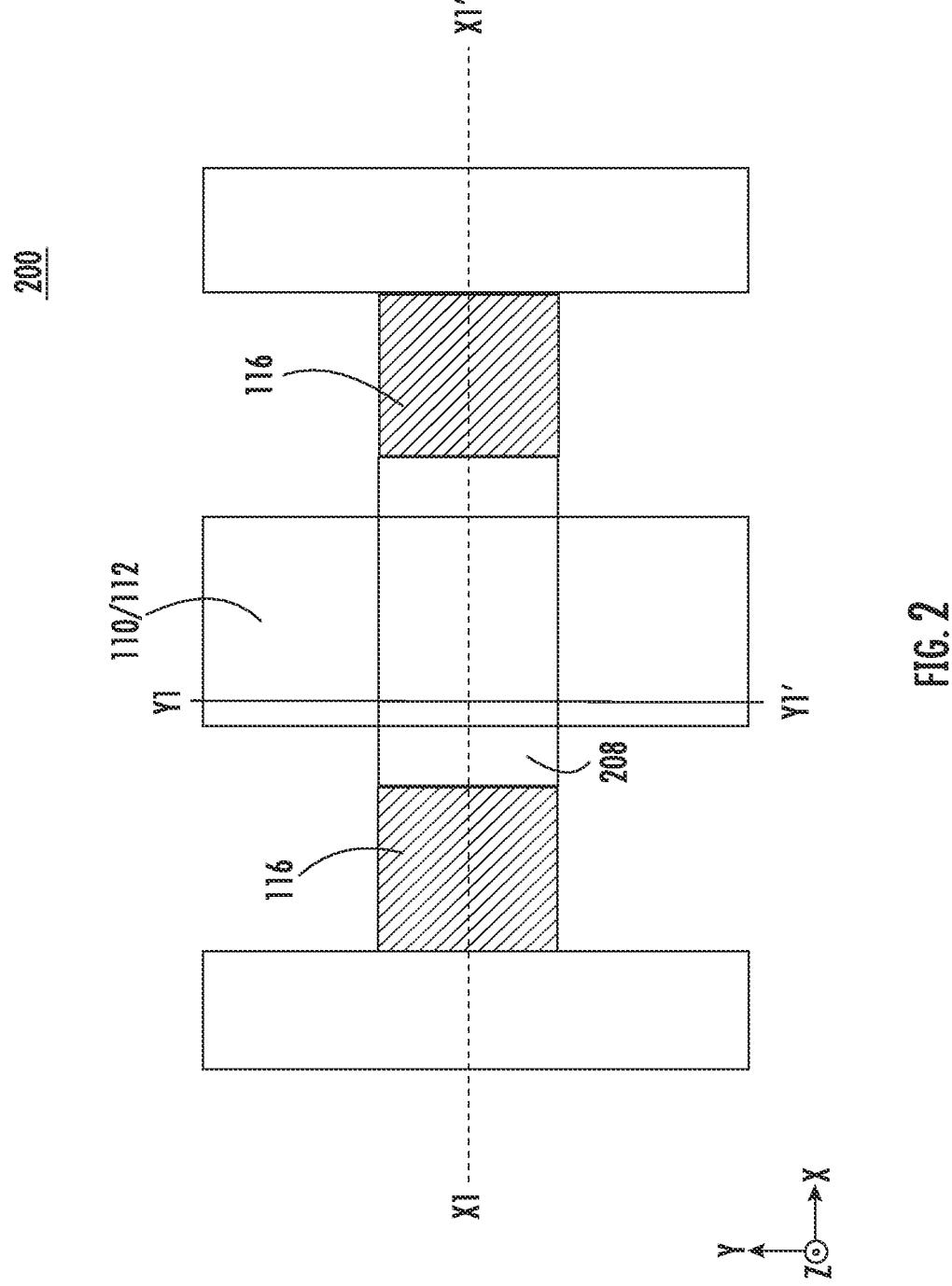
FIG. 2 is a plan view of an integrated circuit device according to some embodiments.
Figures 2A, 2B:
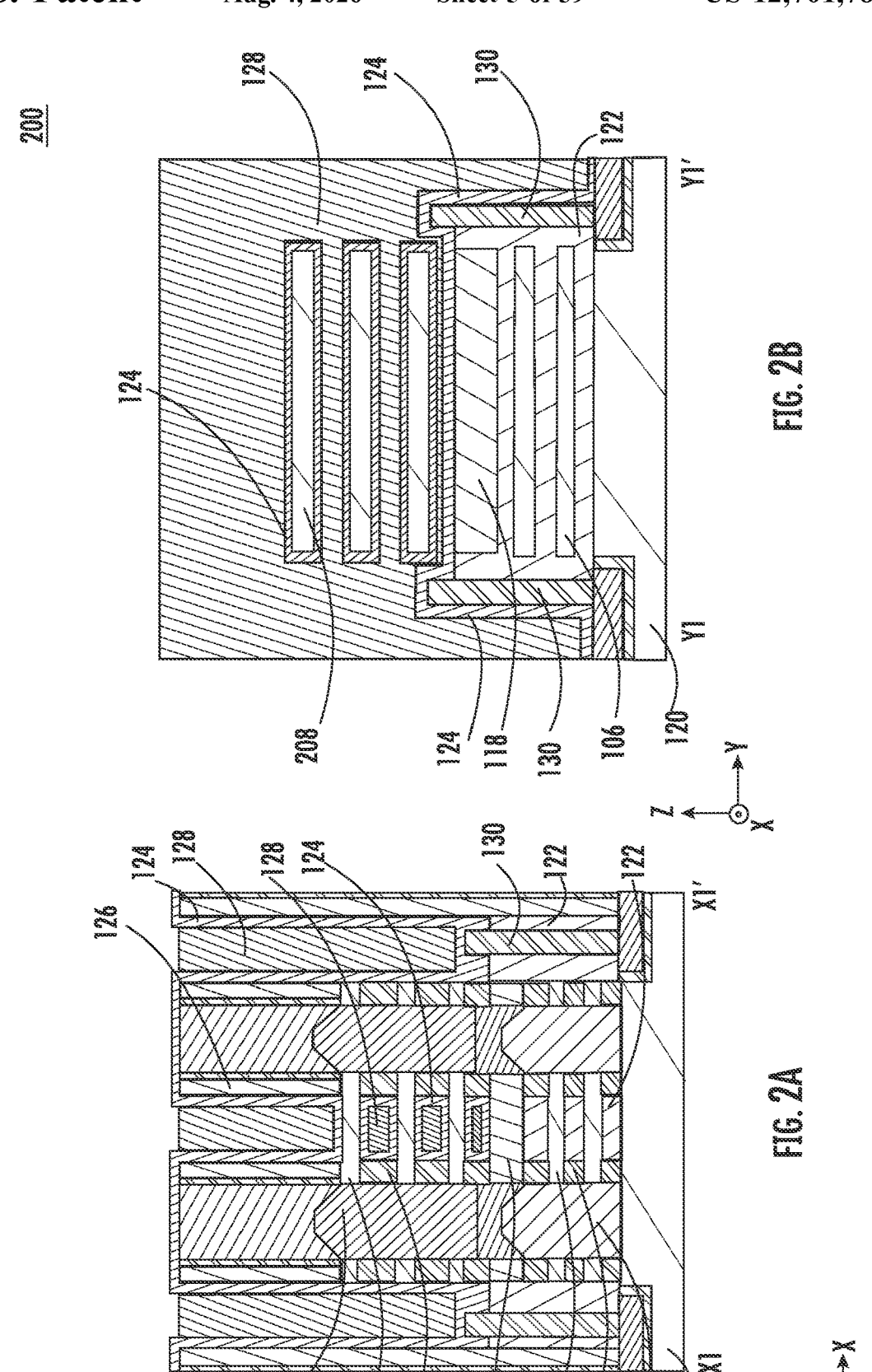
FIGS. 2A and 2B are example cross-sectional views of the integrated circuit device of FIG. 2 according to some embodiments.

FIG. 2 is a plan view of an integrated circuit device 200 according to some embodiments. FIG. 2A is a cross-sectional view of the integrated circuit device 200 taken along line X1-X1' in FIG. 2 according to some embodiments. FIG. 2B is a cross-sectional view of the integrated circuit device 200 taken along line Y1-Y1' in FIG. 2 according to some embodiments.

Referring to FIG. 2, in a plan view, the size of the upper channel region 208 may be the same size of the lower channel region 106. For example, the lengths of the upper channel region 208 in the X-direction and Y-direction may be the same as those of the lower channel region 106, respectively. In a cross-sectional view, referring to FIG. 2B, the upper channel region 208 and the lower channel region 106 may comprise an I-shape.

Referring to FIG. 2B, a first portion of the intergate spacer 130 and a second portion of the intergate spacer 130 may be spaced apart from each other in the Y-direction. Each of the first and second portions of the intergate spacer 130 may have a flat or substantially flat upper surface.

FIGS. 3A, 3B, 3C, and 3D through 16A, 16B, 16C, and 16D are cross-sectional views illustrating methods of forming the integrated circuit device 100 in FIGS. 1, 1A, 1B, 1C, and 1D according to some embodiments.

As shown in FIGS. 3A through 3D, the methods of manufacturing the integrated circuit device 100 may include forming a preliminary stack structure 332 on a substrate 120.

The preliminary stack structure 332 may include a lower stack including a lower channel layer 334 on the substrate 120 and an upper stack including an upper channel layer 336 on the lower stack. The lower channel layer 334 may include a plurality of lower channel layers 334. The upper channel layer 336 may include a plurality of upper channel layers 336.

The lower stack of the preliminary stack structure 332 may also include a plurality of lower sacrificial layers 338 formed on the substrate 120, and the upper stack of the preliminary stack structure 332 may include a plurality of upper sacrificial layers 340 formed on the plurality of lower sacrificial layers 338. The lower sacrificial layers 338 may be alternately stacked with the lower channel layers 334 in the lower stack. Likewise, the upper sacrificial layers 340 may be alternately stacked with the upper channel layers 336 in the upper stack. In subsequent processes, the upper sacrificial layers 340 and the lower sacrificial layers 338 may be selectively removed with respect to the lower and upper channel layers 334 and 336 and thus may include material(s) different from the lower and upper channel layers 334 and 336. The upper and lower sacrificial layers 340 and 338 may include, for example, silicon germanium (SiGe).

An integrated sacrificial layer 318 may be formed between the lower sacrificial layers 338 and the upper sacrificial layers 340. The integrated sacrificial layer 318 may have a larger thickness than each of the lower and upper channel layers 334 and 336, and each of the lower and upper sacrificial layers 338 and 340 in the Z-direction. The lower channel layers 334, the upper channel layers 336, and the integrated sacrificial layer 318 may be semiconductor layers that include, for example, silicon (Si).

In subsequent processes, a dummy gate insulator 342 and a preliminary intergate spacer layer 330 may be formed sequentially on the preliminary stack structure 332. The preliminary intergate spacer layer 330 may be formed on (e.g., may cover) an upper surface and side surfaces of the dummy gate insulator 342. For example, the dummy gate insulator 342 may include oxide (e.g., $SiO_2$), and the preliminary intergate spacer layer 330 may include nitride (e.g., SiN). In some embodiments, each of the dummy gate insulator 342 and the preliminary intergate spacer layer 330 may have a uniform thickness. For example, the dummy gate insulator 342 may conformally extend along the upper surface and the side surfaces of the preliminary stack structure 332, and the preliminary intergate spacer layer 330 may conformally extend along the upper surface and the side surfaces of the dummy gate insulator 342, as illustrated in FIG. 3A.

Figures 3A, 3B:
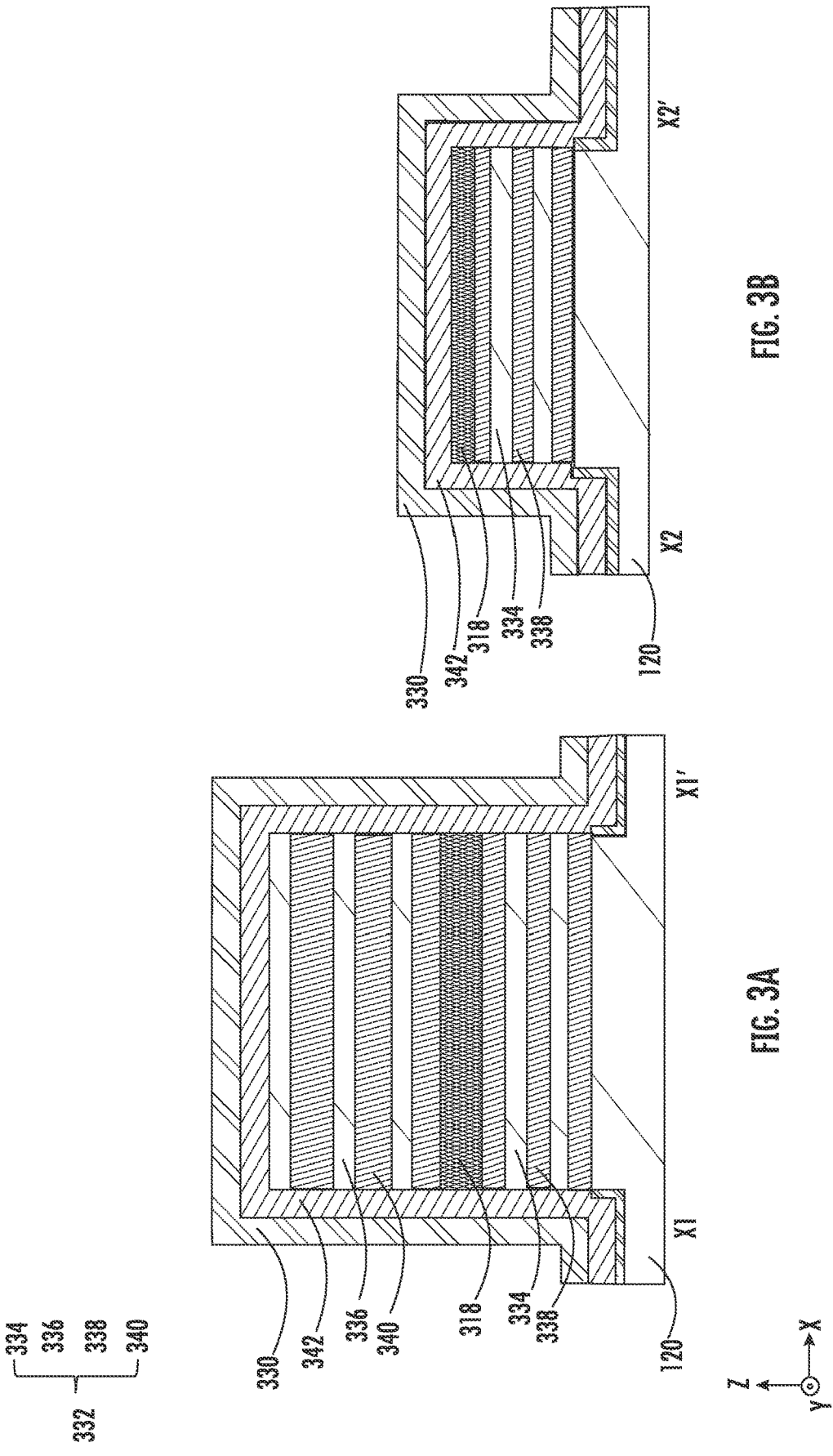
Figures 3C, 3D:
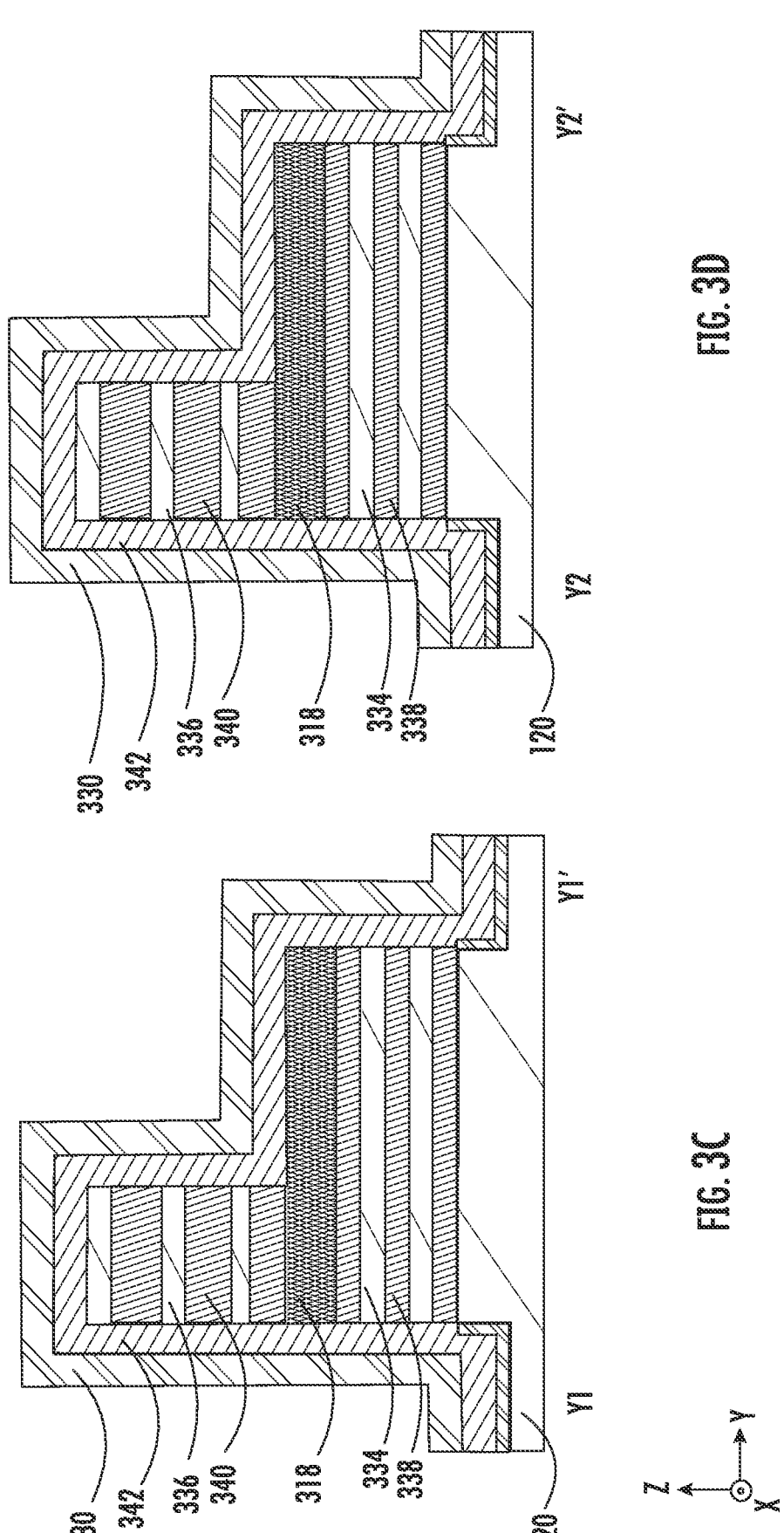
Figures 6A, 6B:
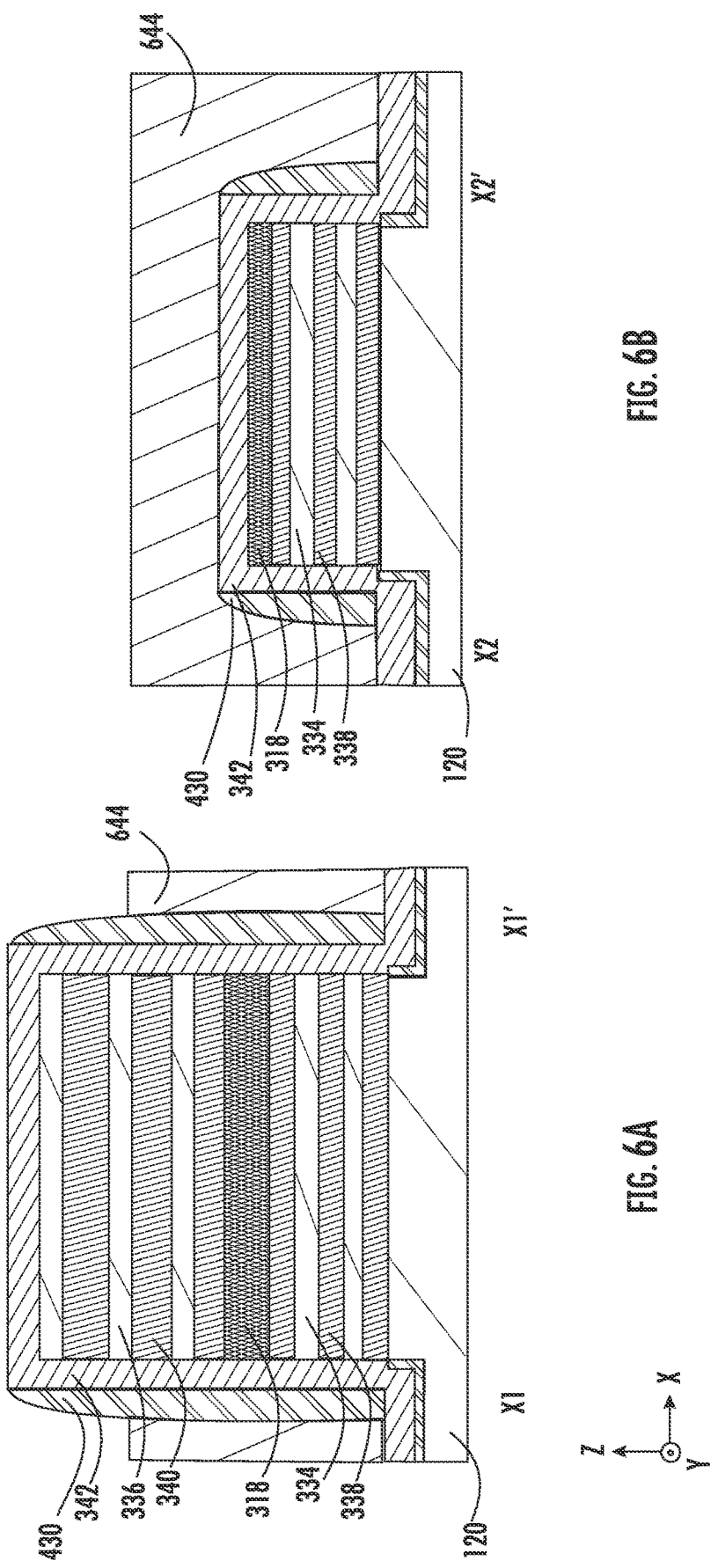
Figures 6C, 6D:
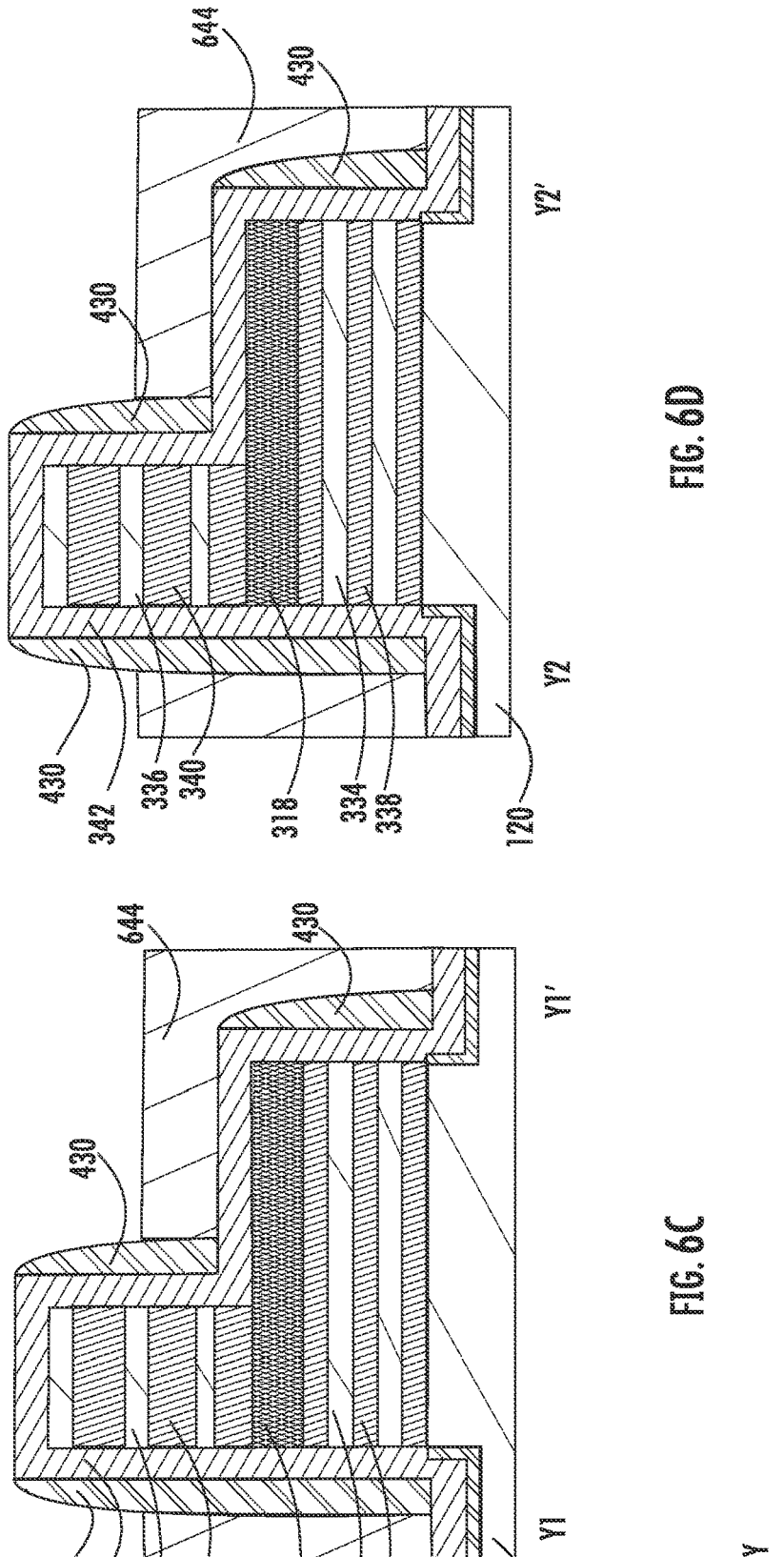
Figures 7C, 7D:
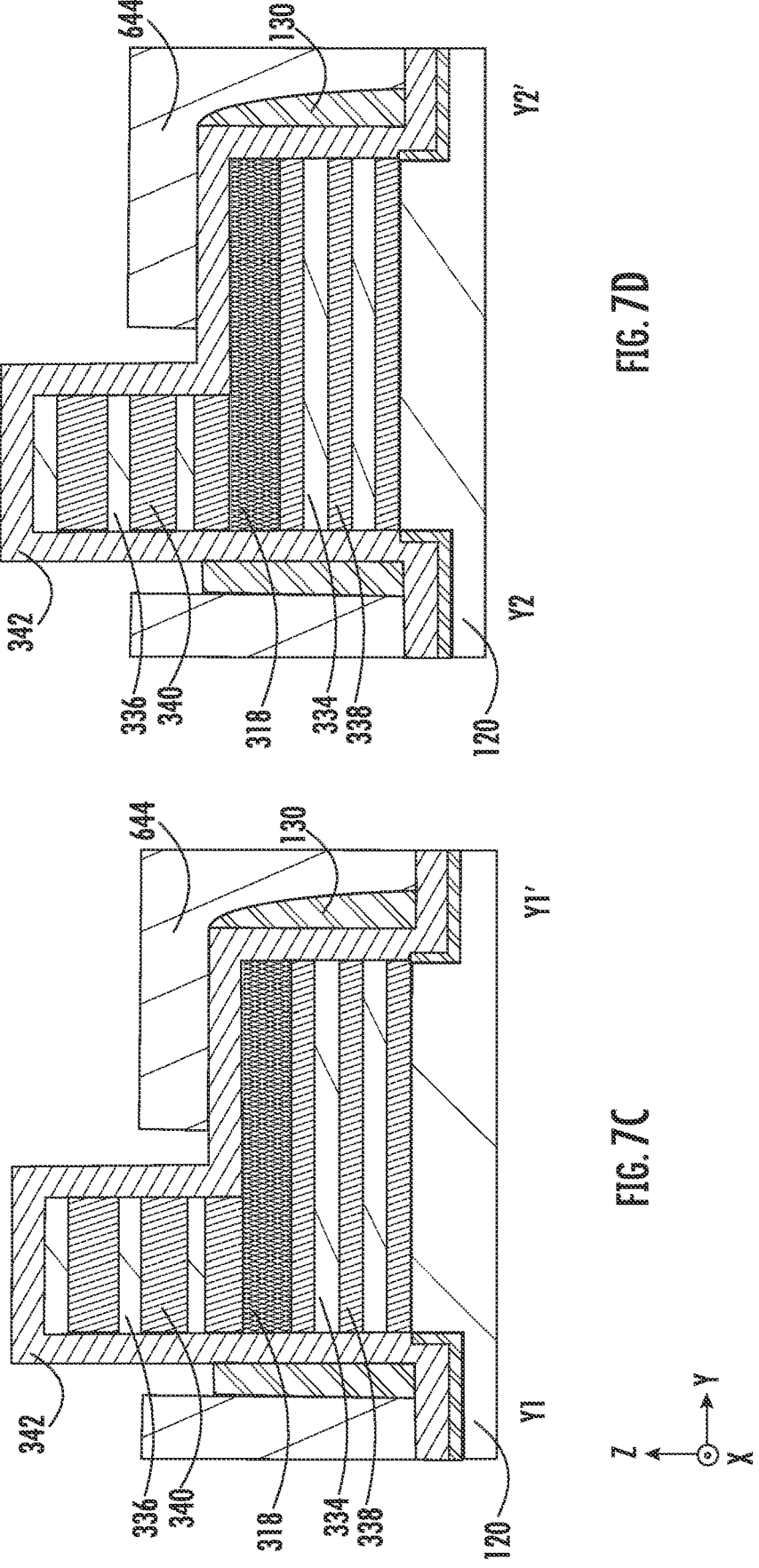
Figure 8B:
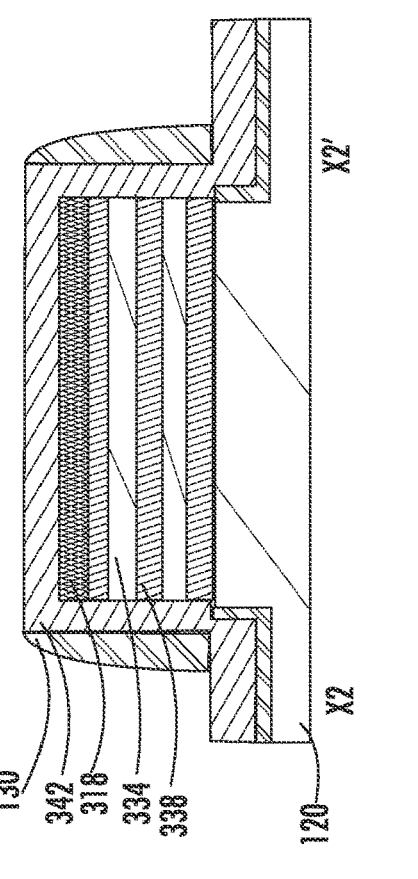
Figure 8A:
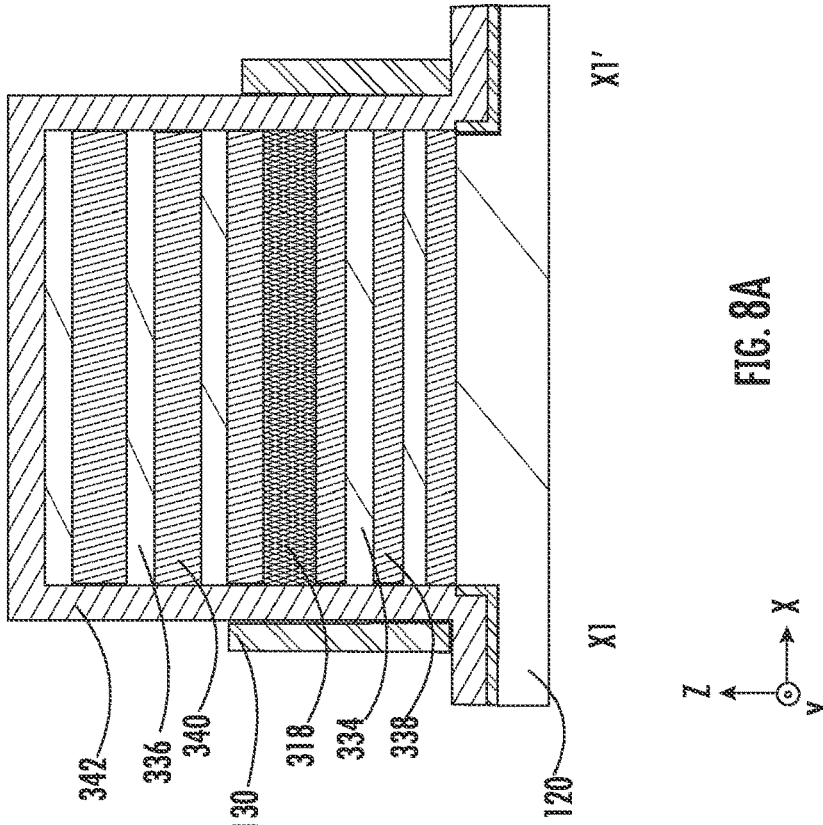
Figures 8C, 8D:
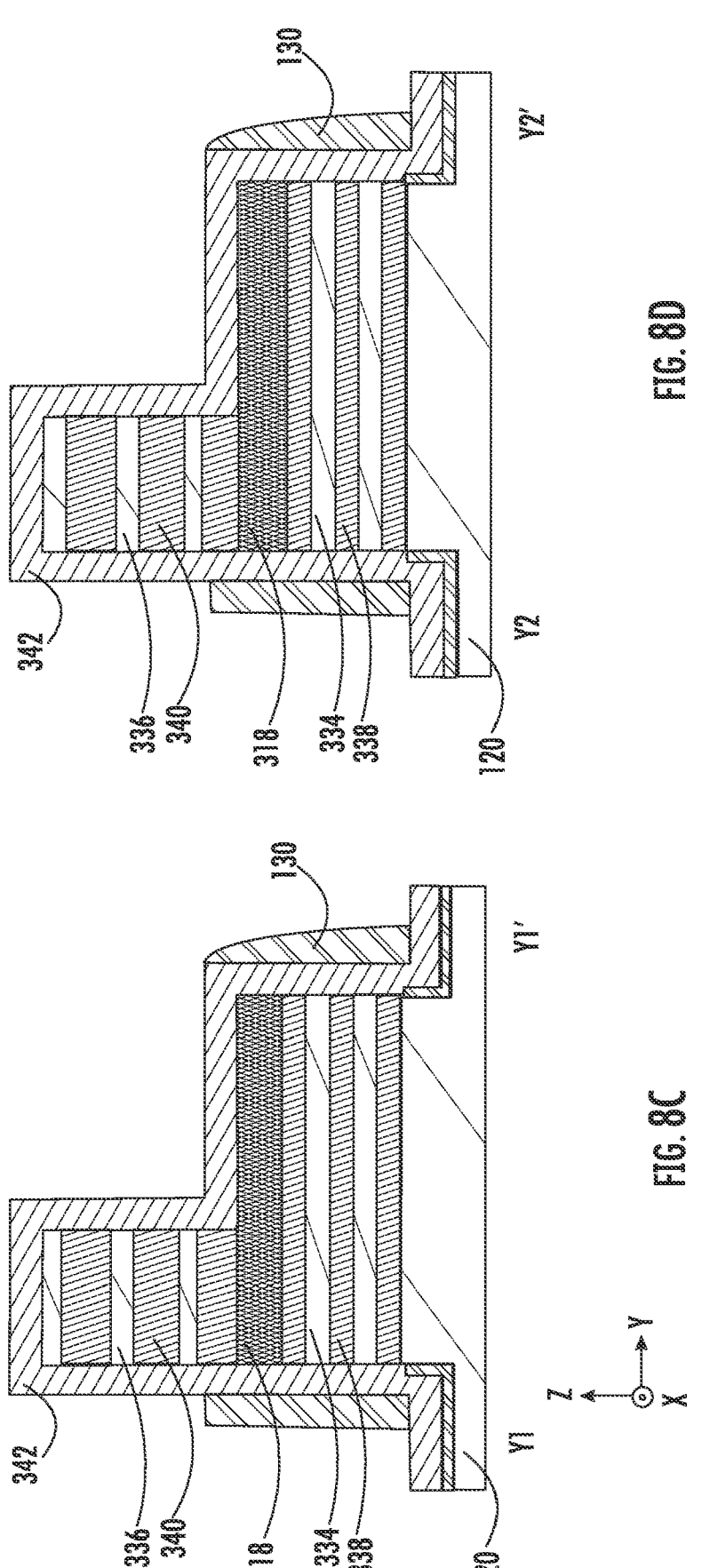
Figure 9B:
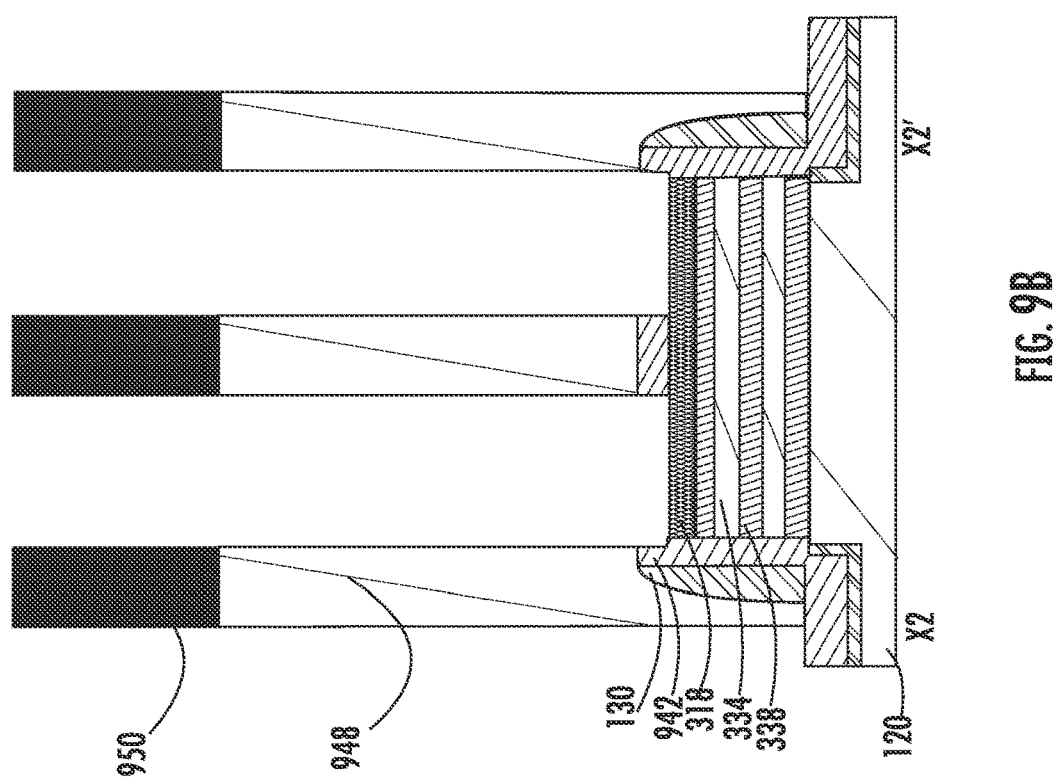
Figure 9A:
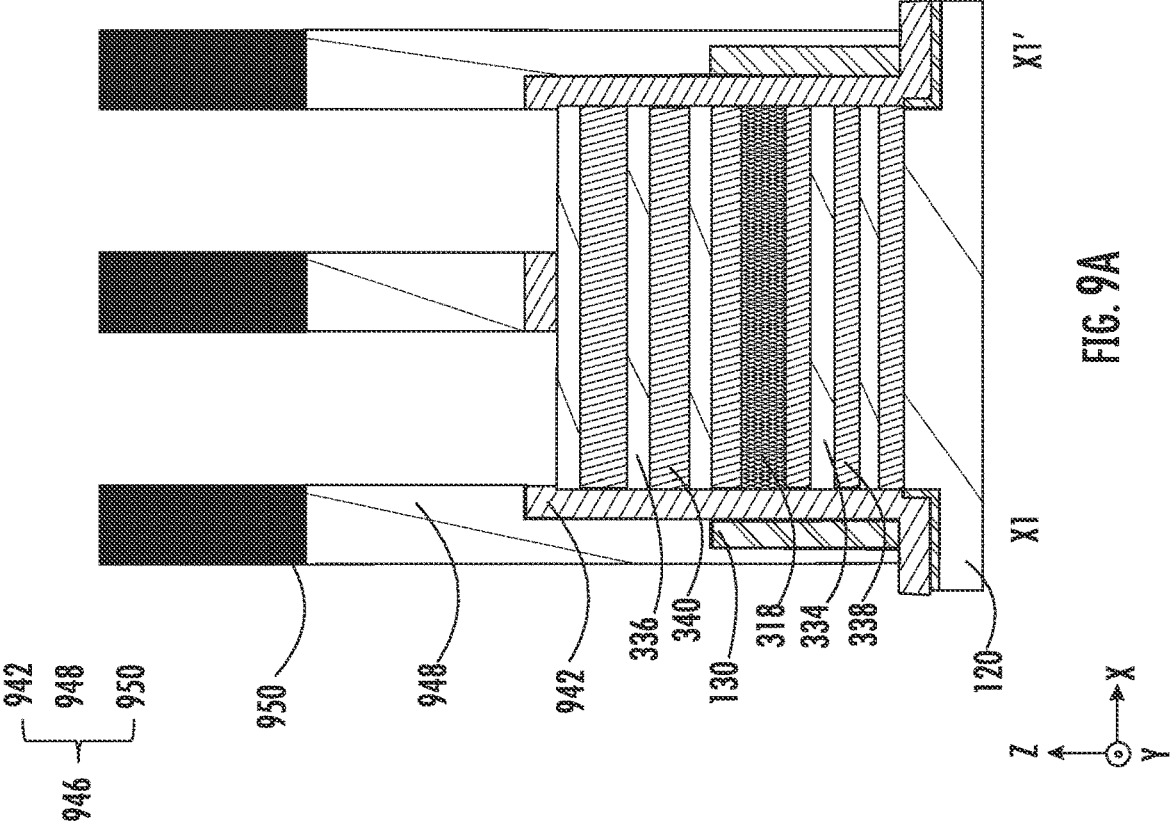
Figure 9D:
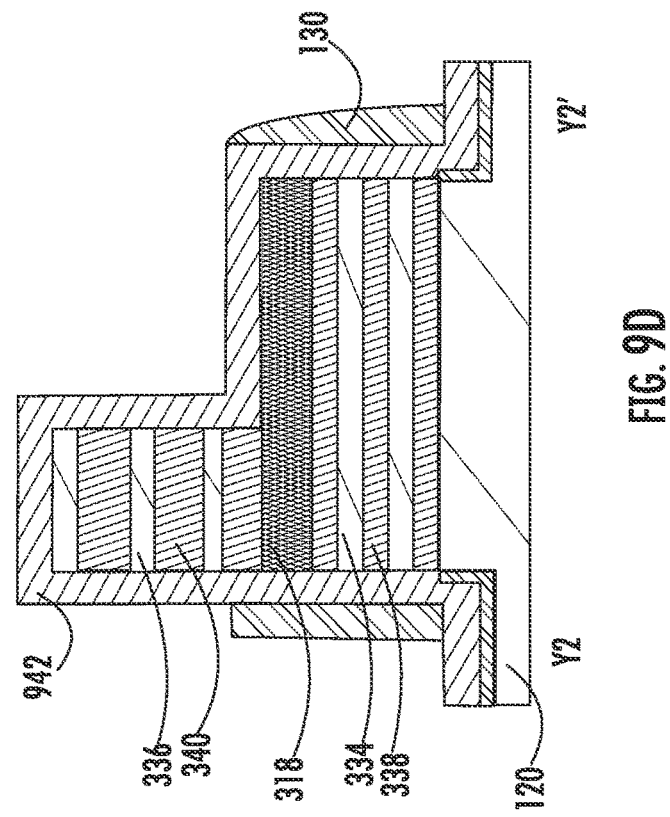
Figure 9C:
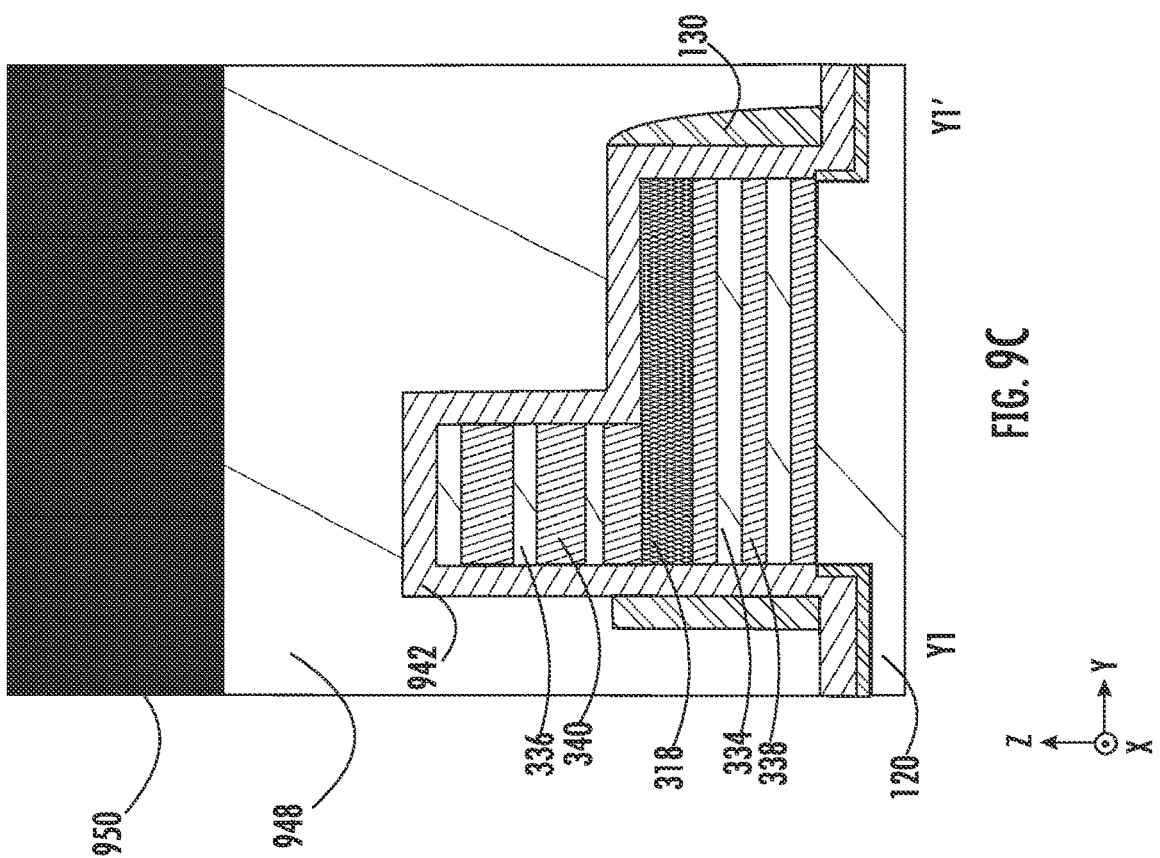
Figure 10B:
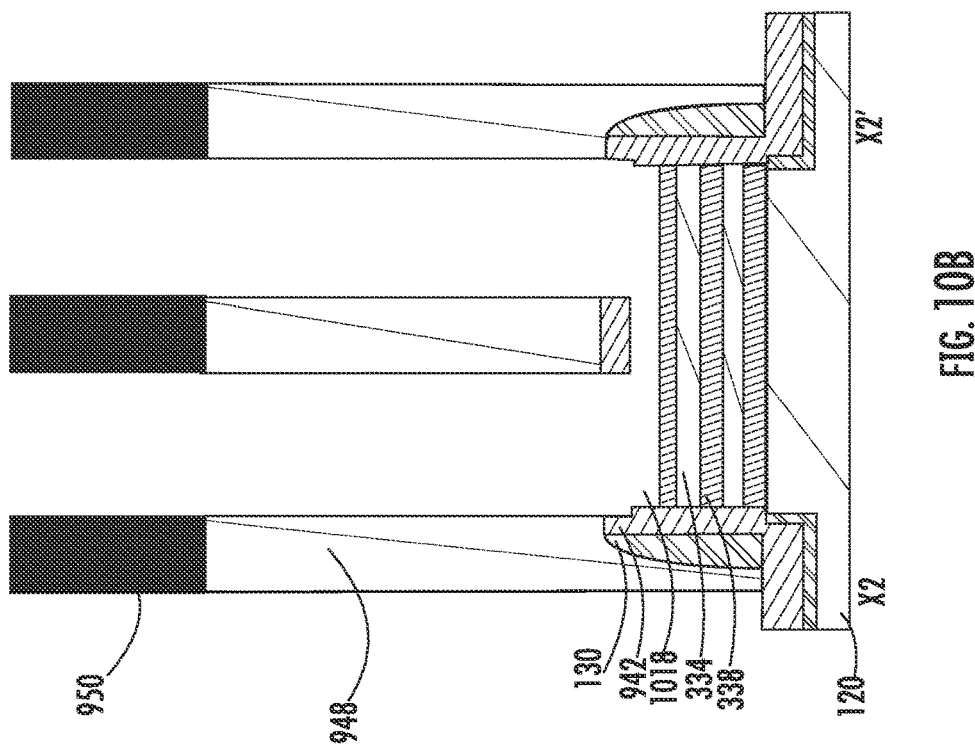
Figure 10A:
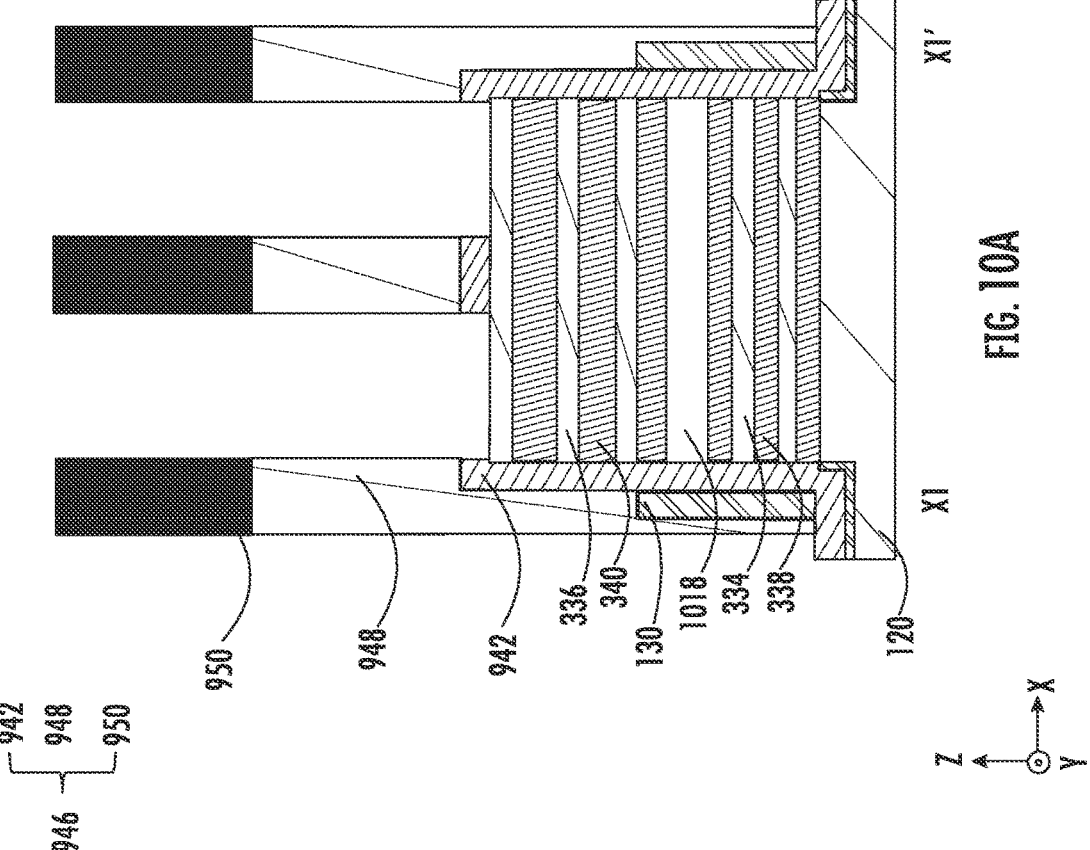
Figure 10D:
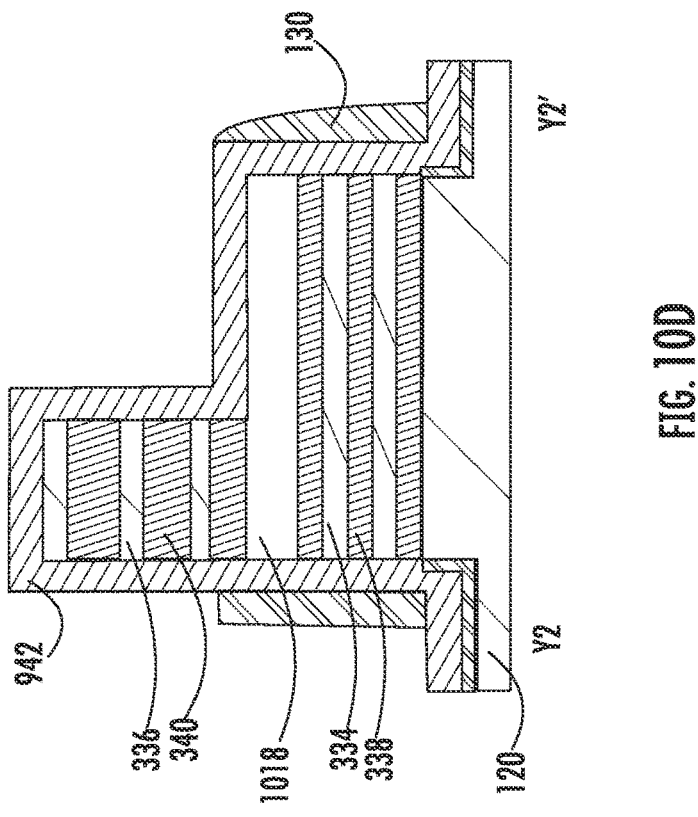
Figure 10C:
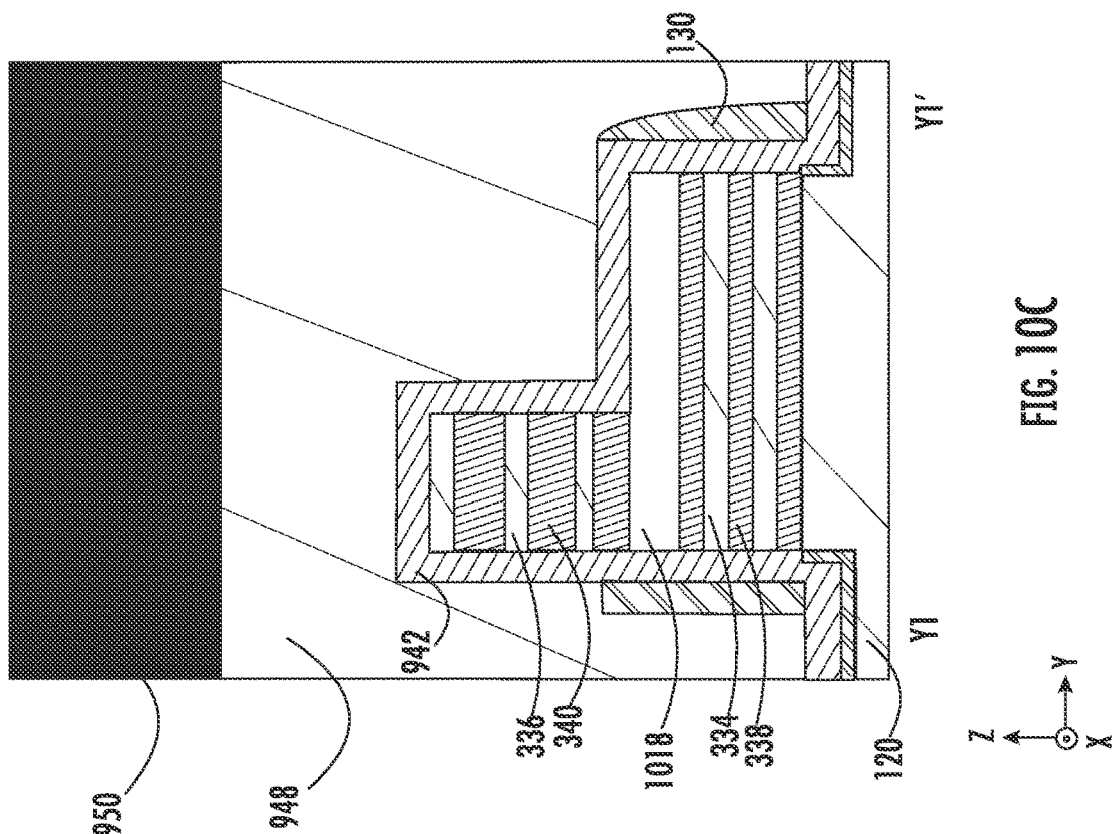
Figures 11A, 11B:
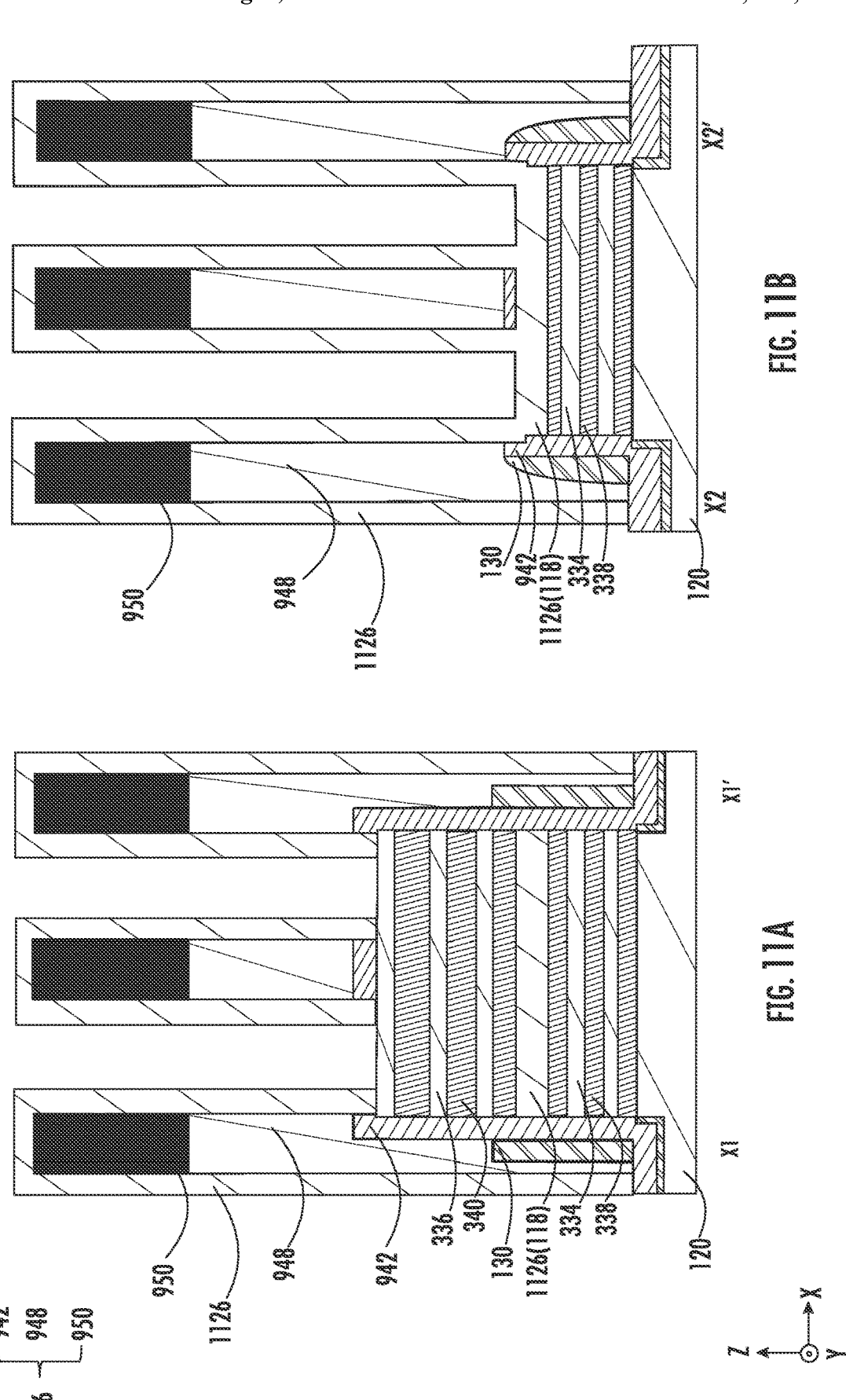
Figures 11C, 11D:
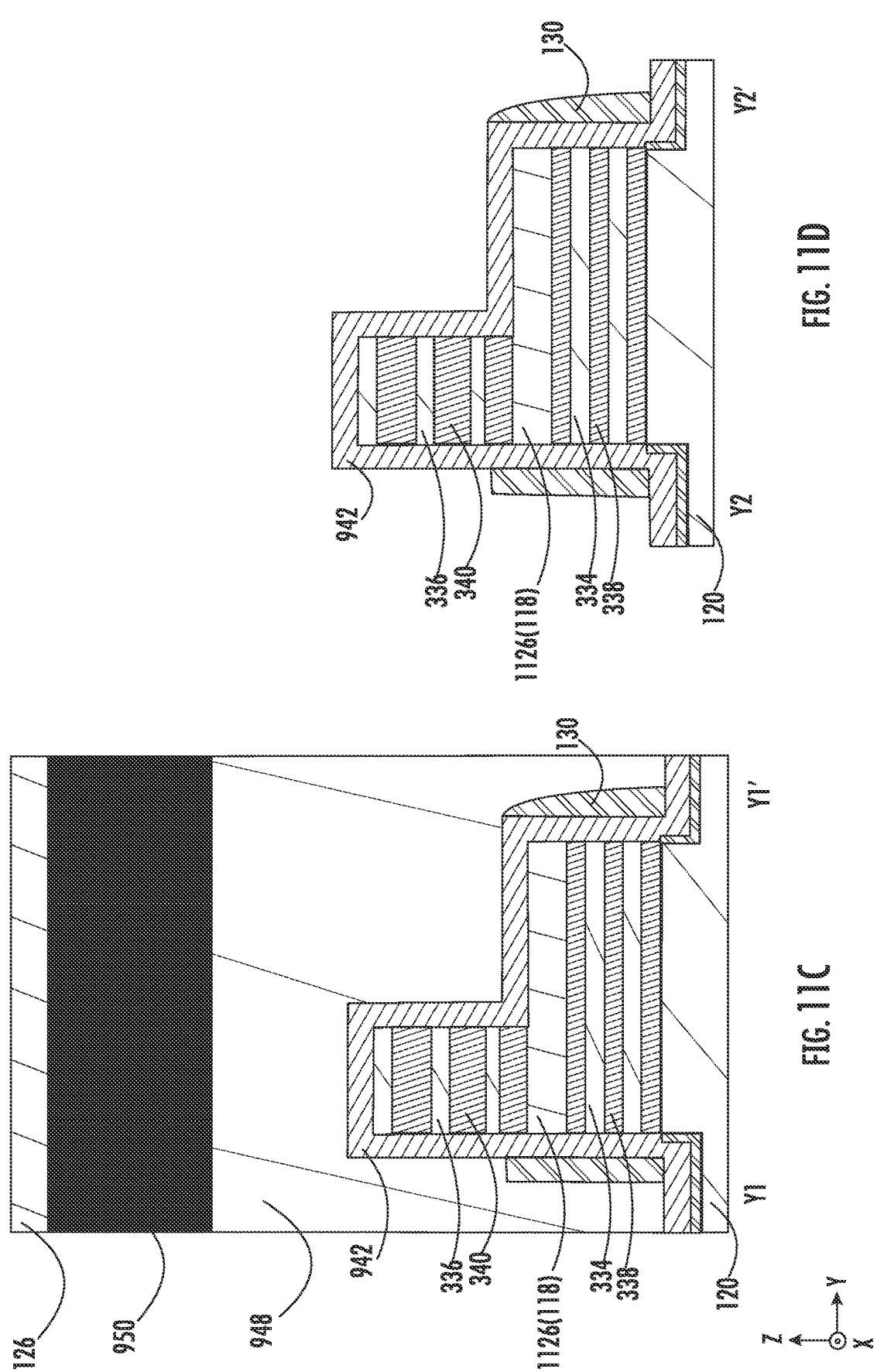
Figures 12A, 12B:
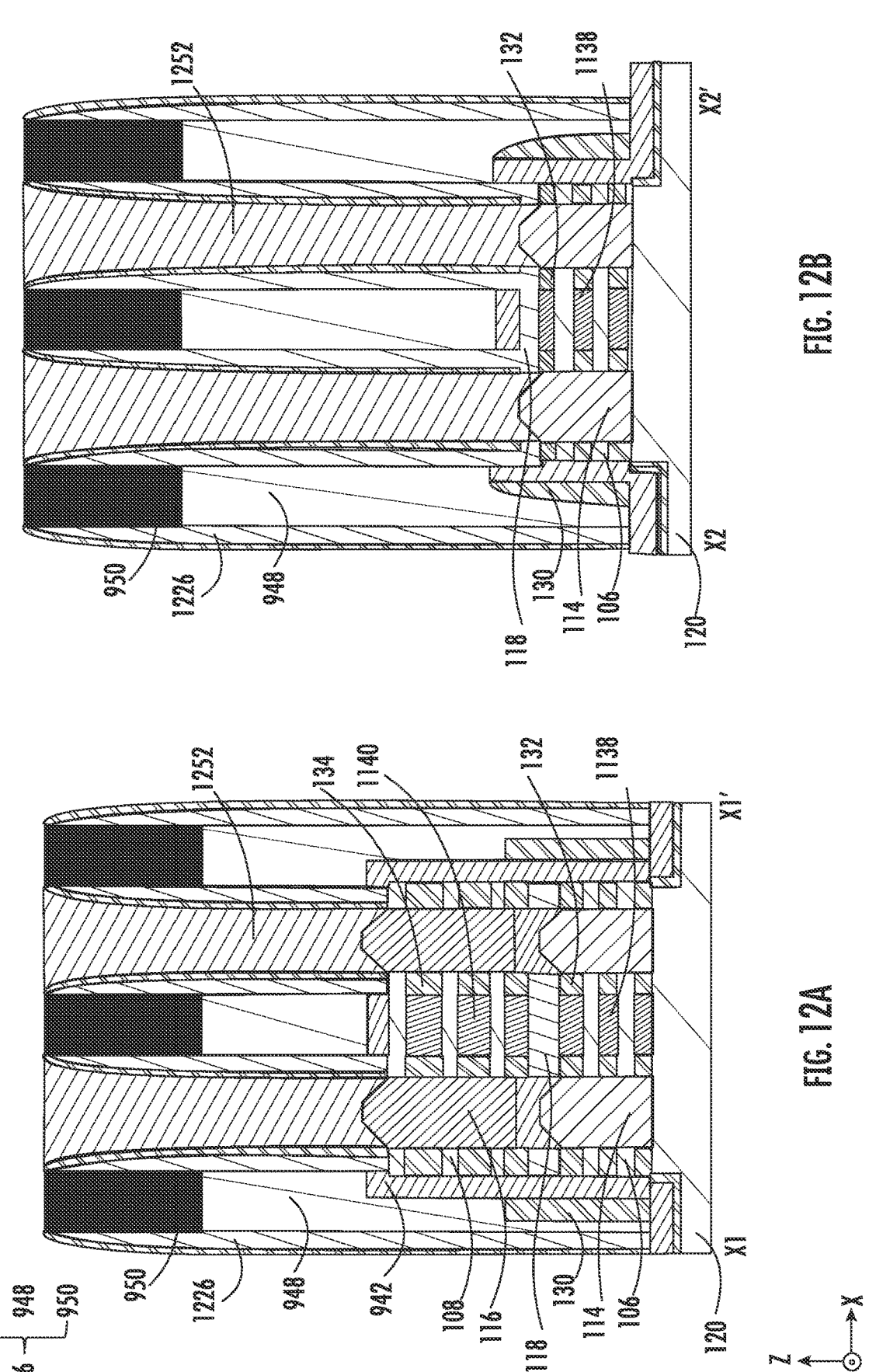
Figures 12C, 12D:
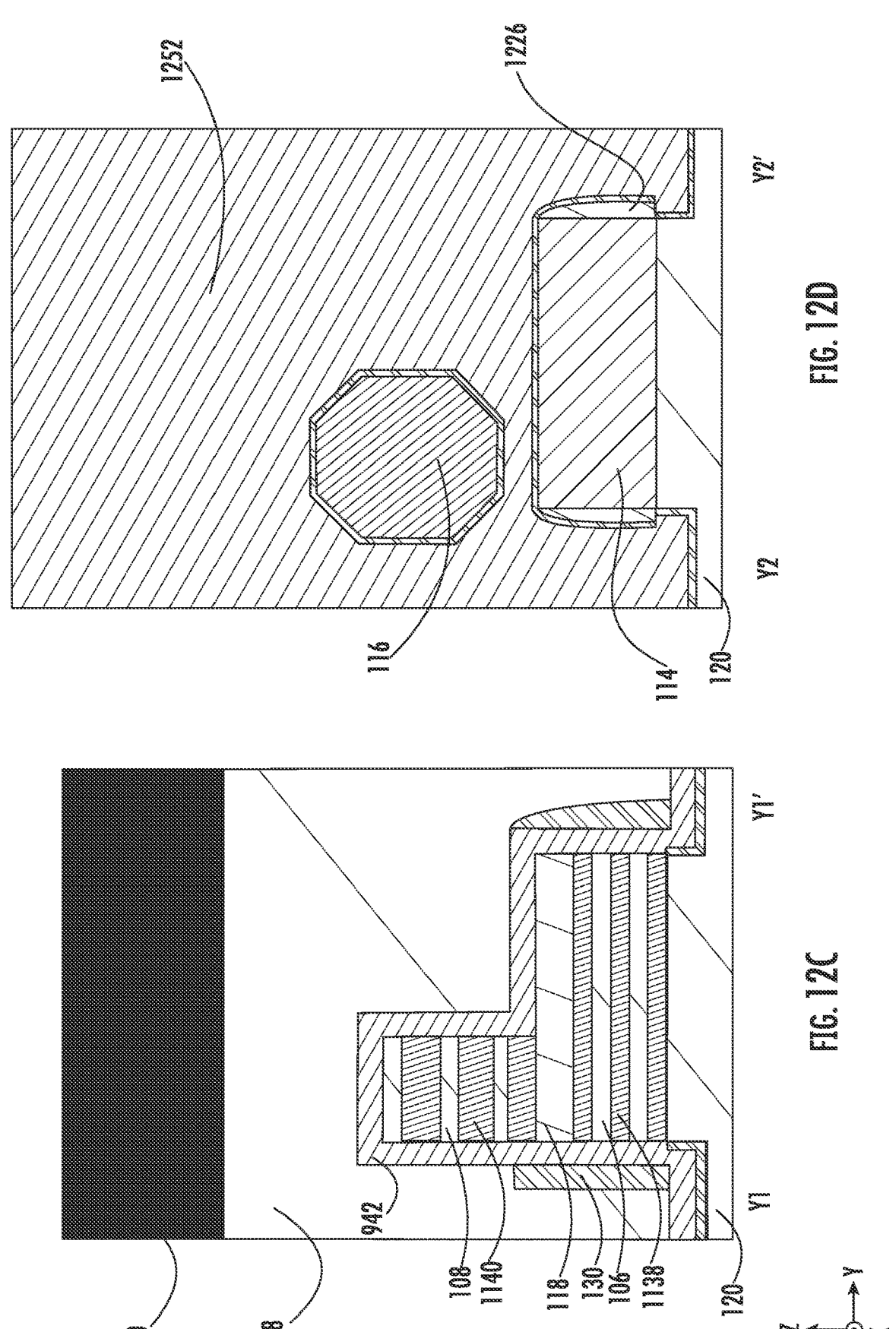
Figure 13B:
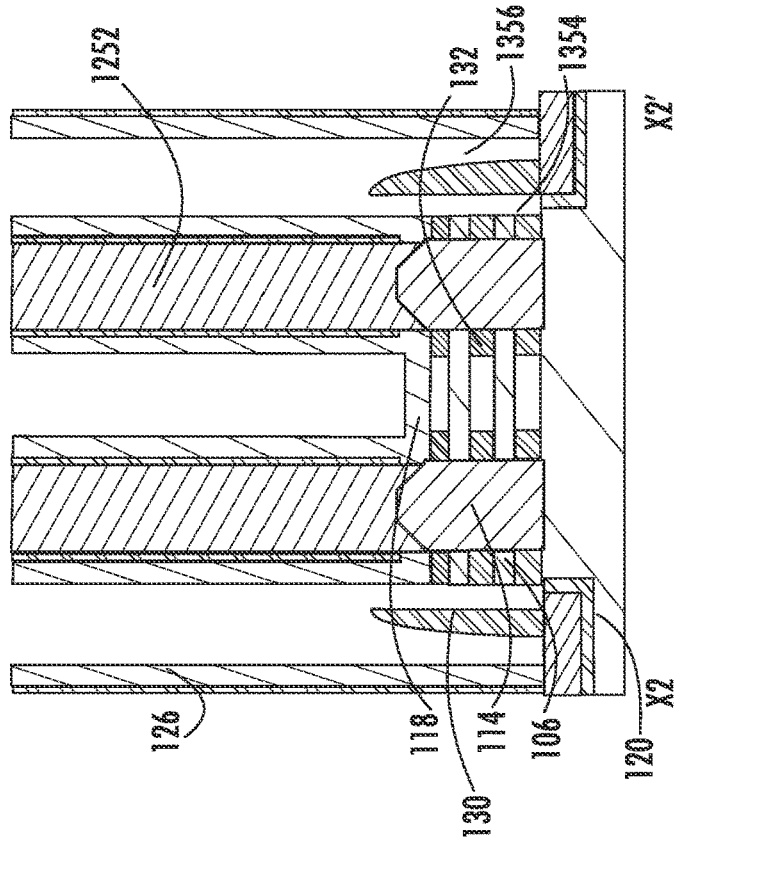
Figure 13A:
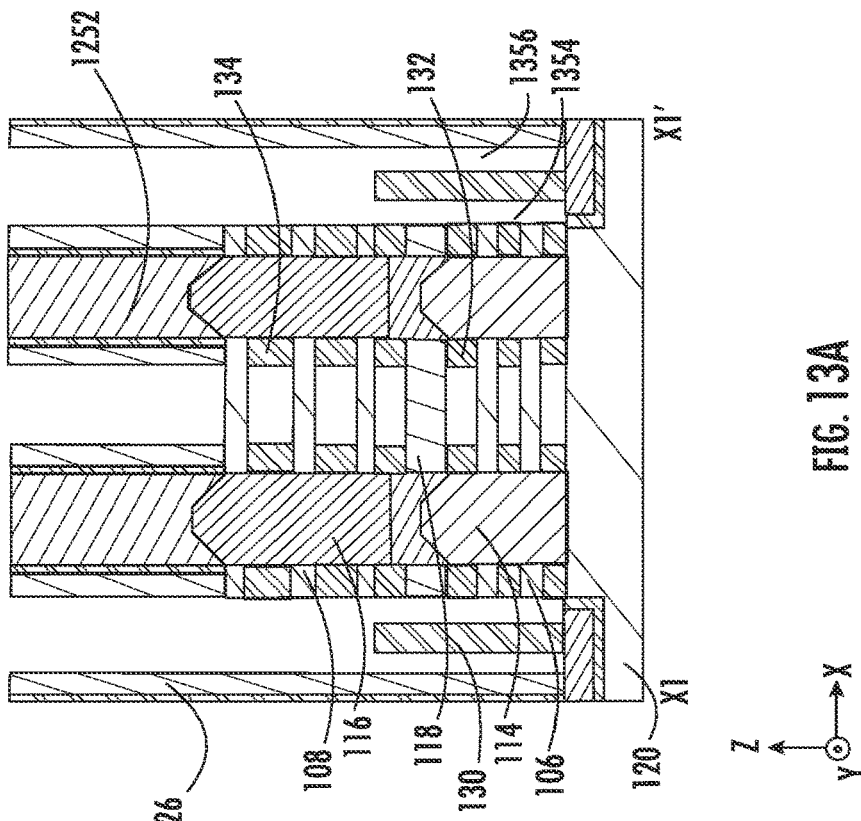
Figures 13C, 13D:
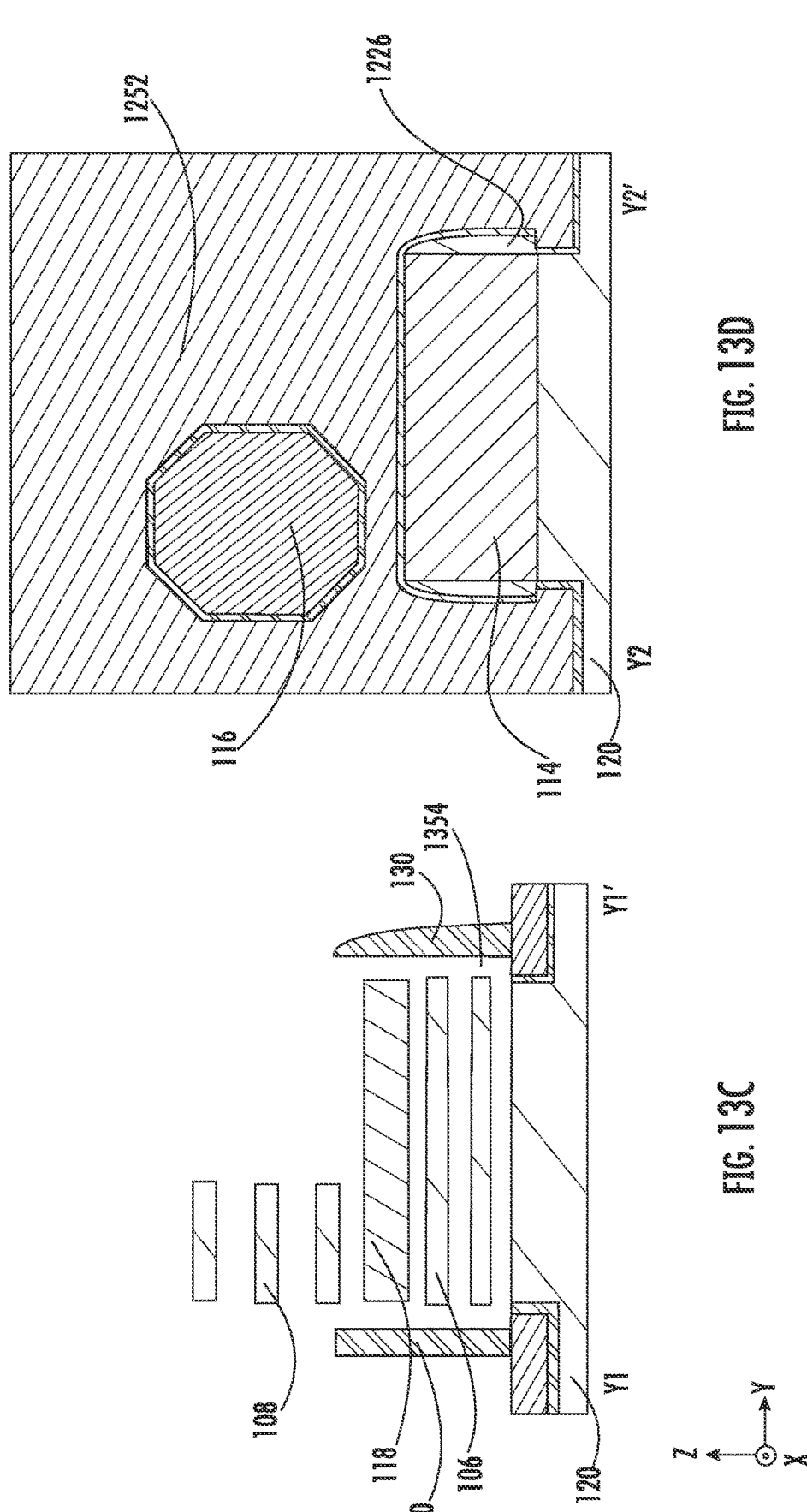
Figure 14B:
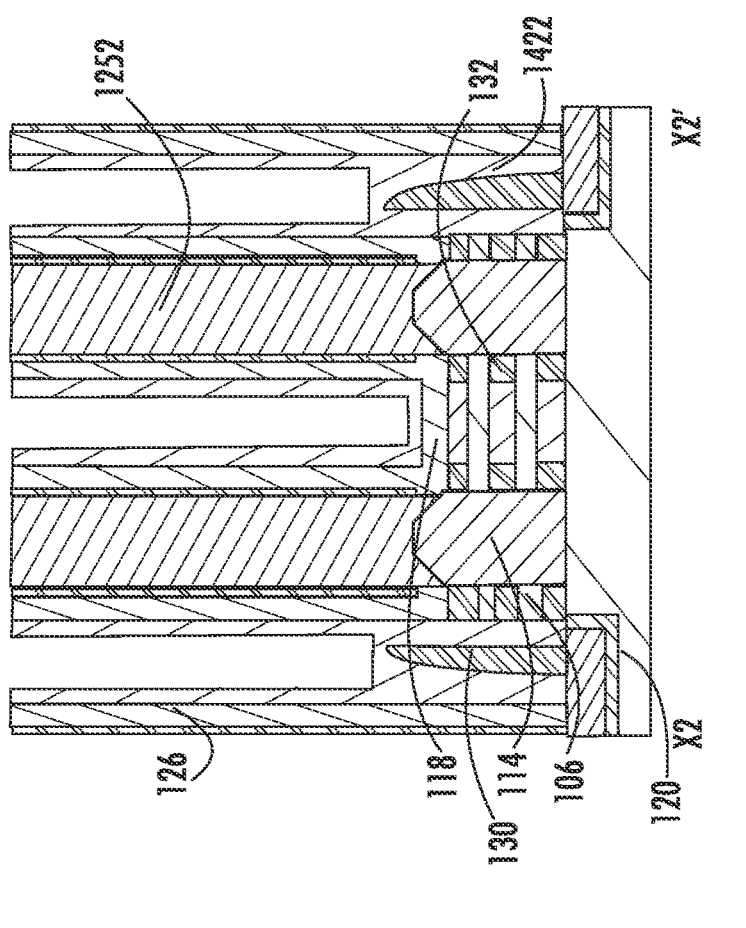
Figure 14A:
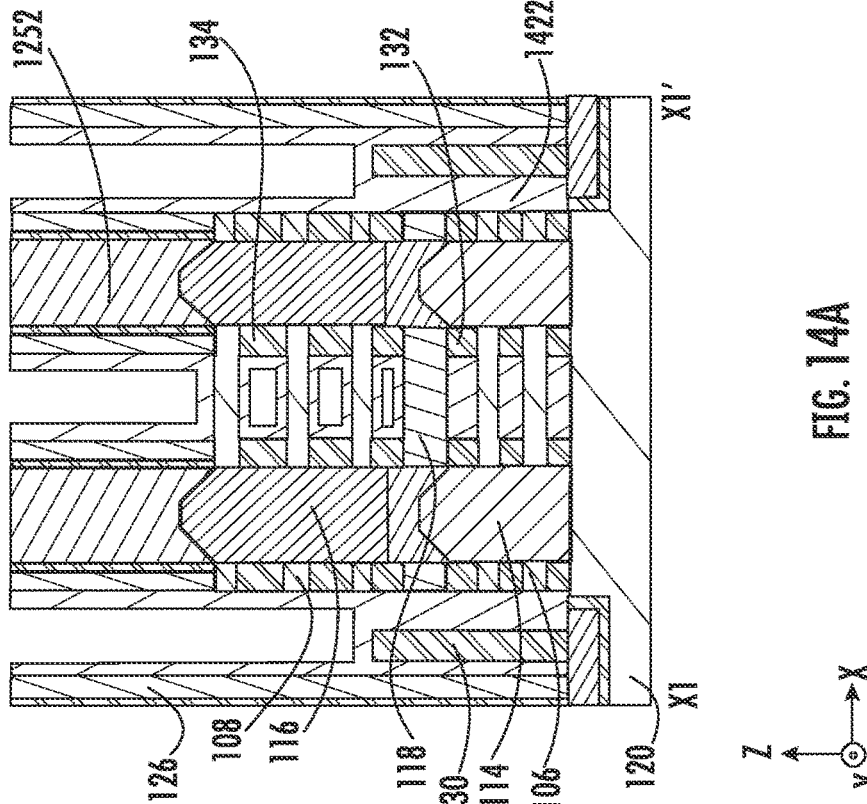
Figures 14C, 14D:
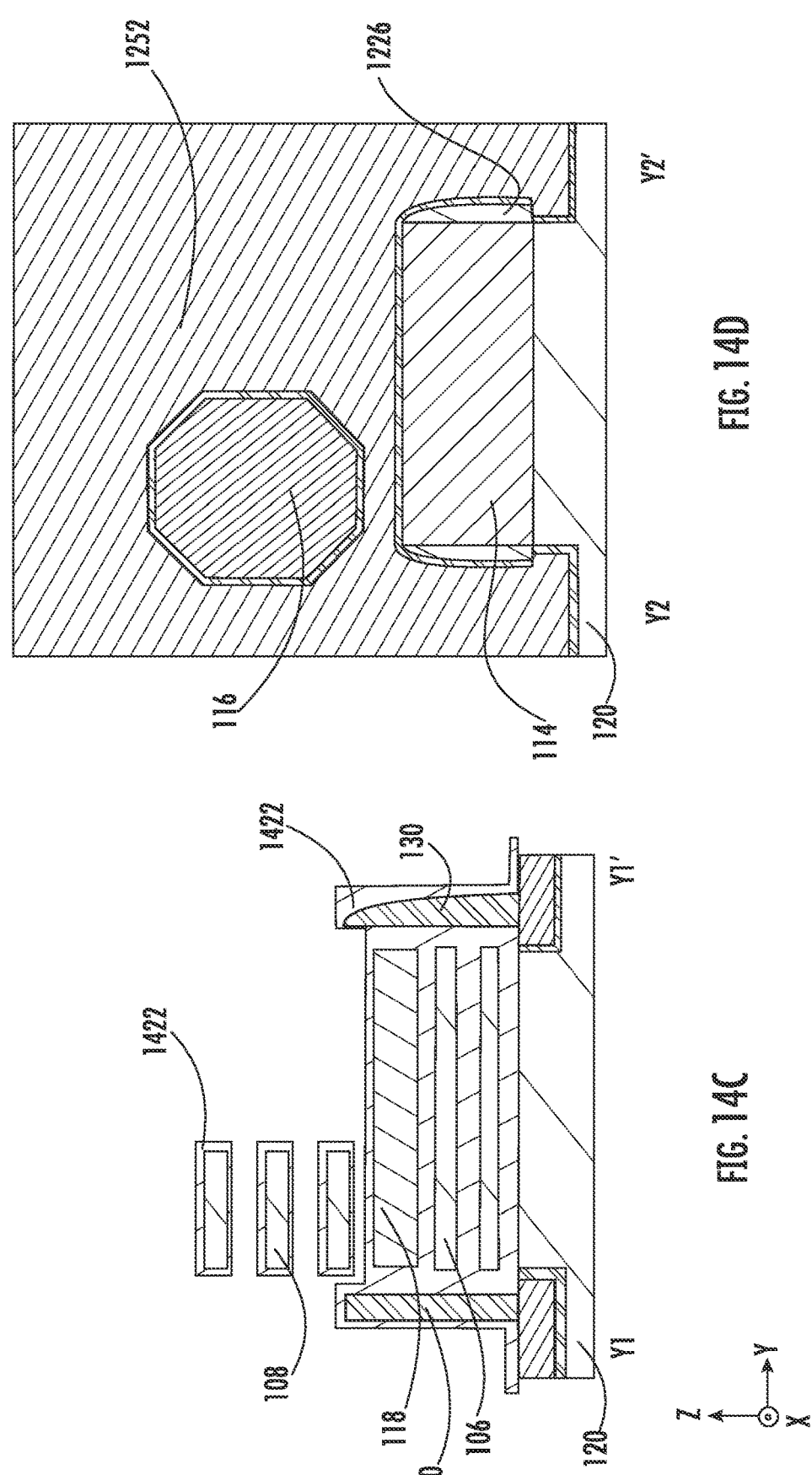
Figure 15B:
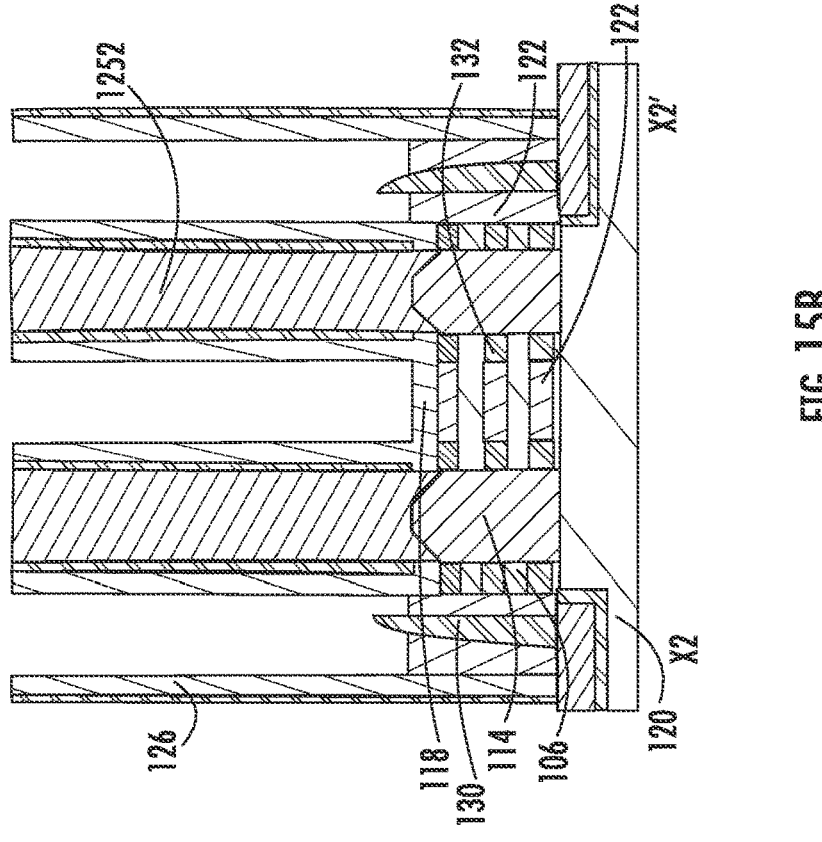
Figure 15A:
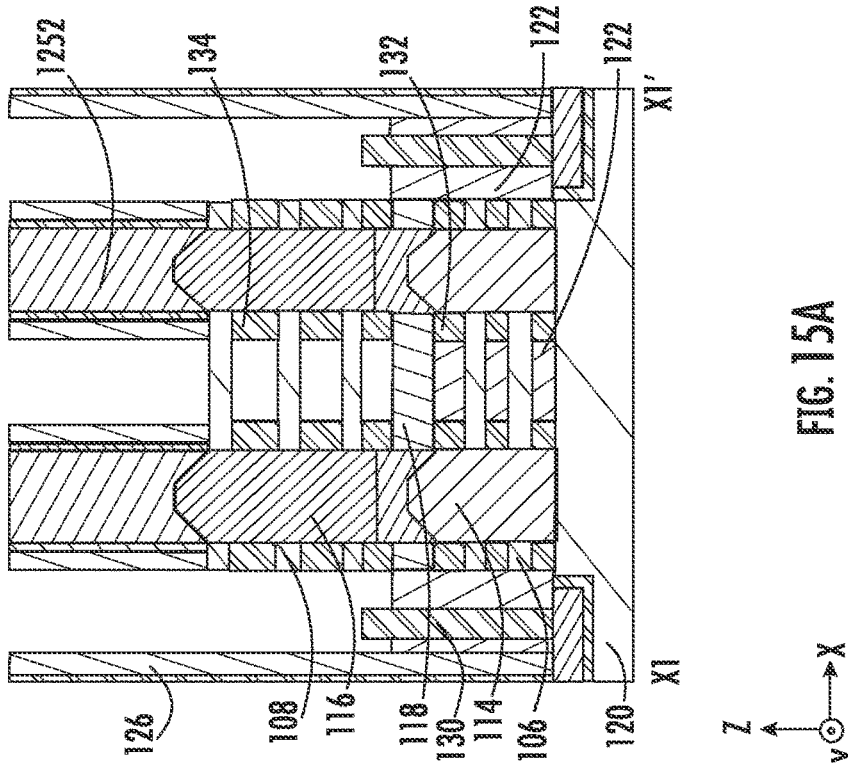
Figures 15C, 15D:
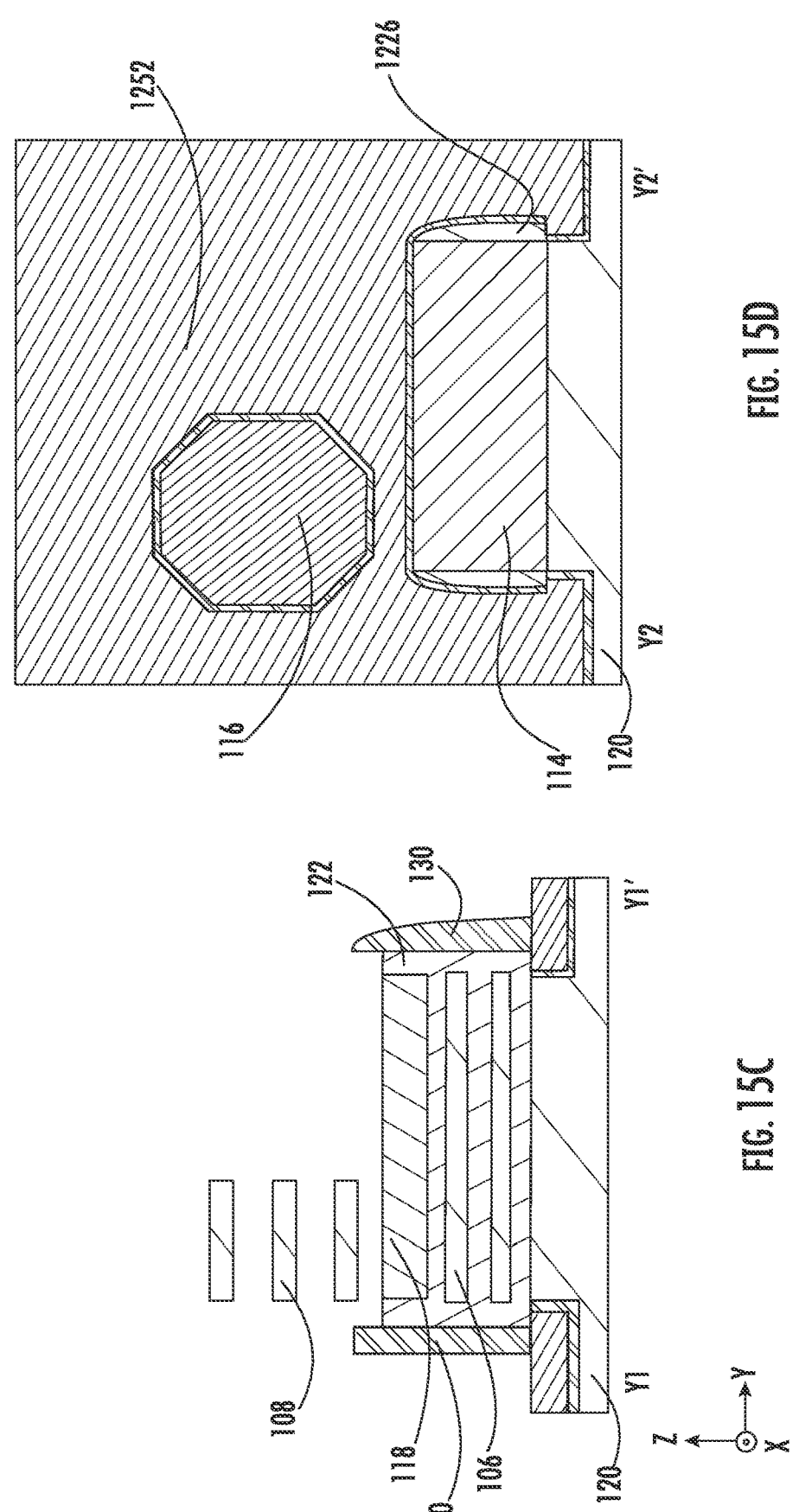
Figures 16A, 16B:
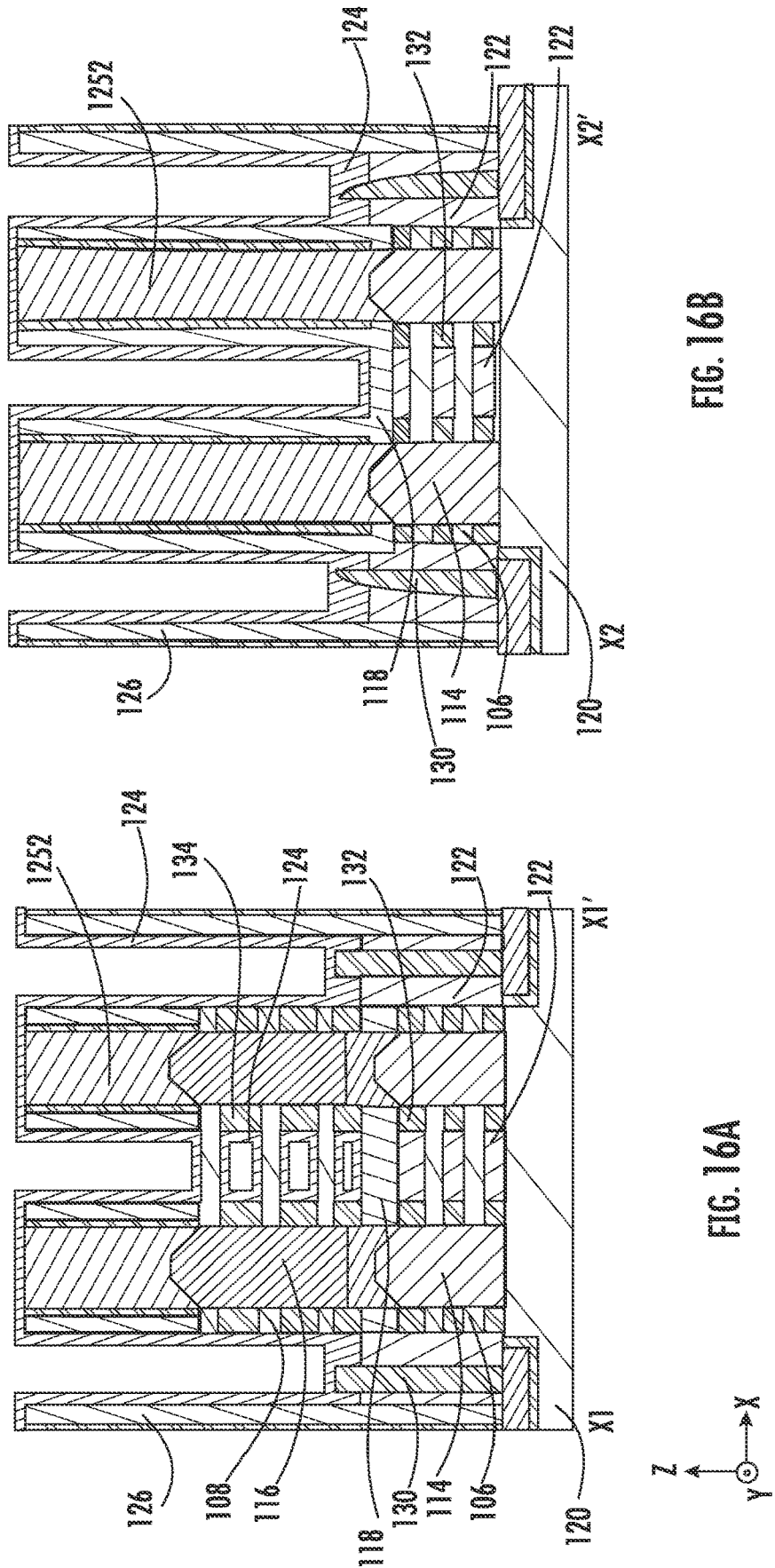
Figures 16C, 16D:
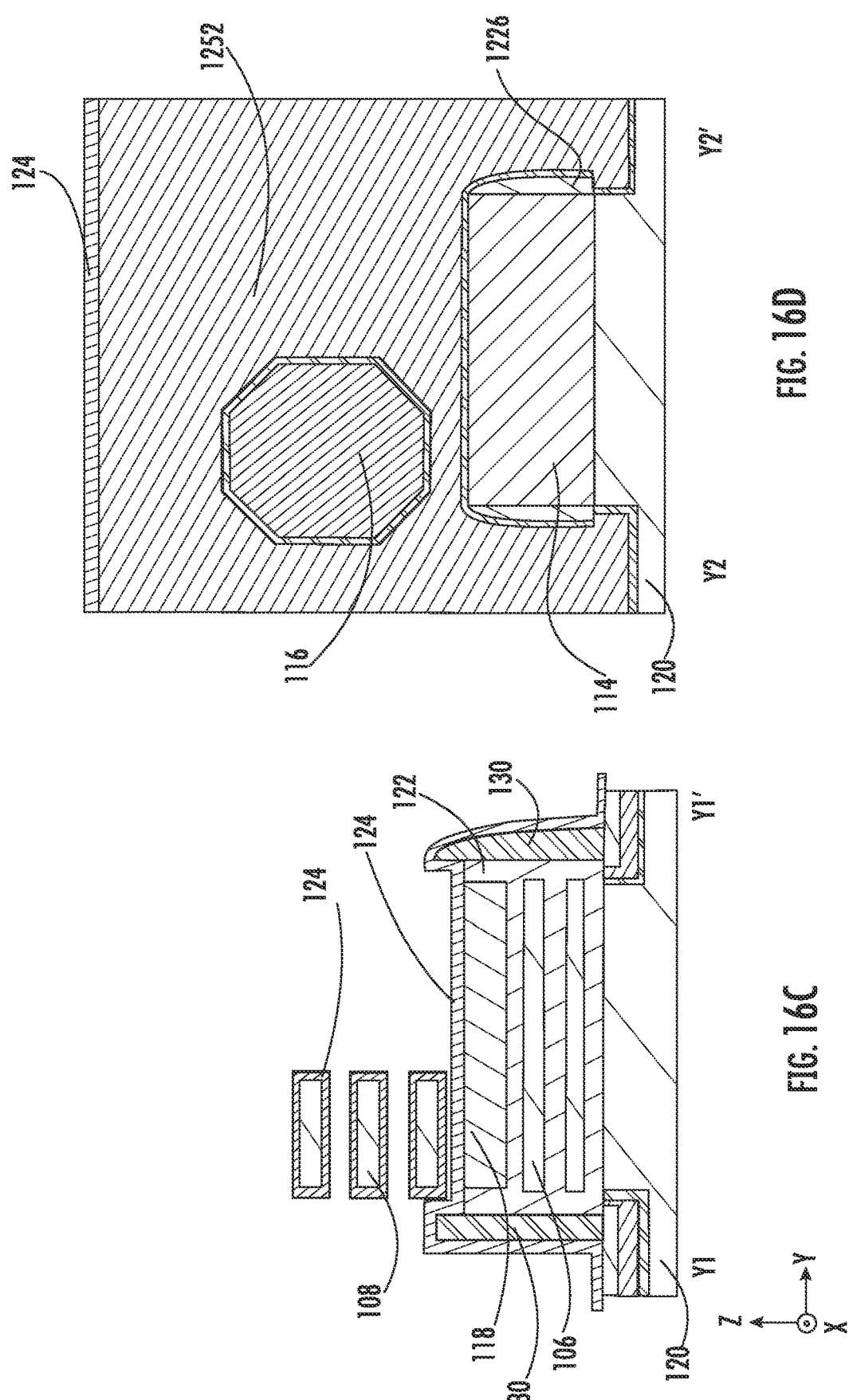

Although FIG. 3A illustrates the dummy gate insulator 342 as a single layer, the dummy gate insulator 342 may include multiple layers sequentially stacked on the preliminary stack structure 332. In some embodiments, the dummy gate insulator 342 may include a semiconductor layer (e.g., a polysilicon layer) and an insulating layer (e.g., a silicon oxide layer) sequentially stacked on the preliminary stack structure 332. The semiconductor layer of the dummy gate insulator 342 may extend between the preliminary stack structure 332 and the insulating layer of the dummy gate insulator 342. The semiconductor layer of the dummy gate insulator 342 may have a thickness thicker than a thickness of the insulating layer of the dummy gate insulator 342. For example, the thickness of the semiconductor layer of the dummy gate insulator 342 may be in a range of from 2 nanometers (nm) to 10 nm (e.g., about 5.5 nm), and the thickness of the insulating layer of the dummy gate insulator 342 may be in a range of from 1 nm to 5 nm (e.g., about 2.5 nm).

As shown in FIGS. 4A through 4D, an upper portion of the preliminary intergate spacer layer 330 may be removed to form a preliminary intergate spacer 430. The preliminary intergate spacer 430 may expose an upper surface of the dummy gate insulator 342. The preliminary intergate spacers 430 may be formed on (e.g., may cover) the side surfaces of the dummy gate insulator 342.

As shown in FIGS. 5A to 5D, a mask layer 544 may be formed on the dummy gate insulator 342 and the preliminary intergate spacer 430. The mask layer 544 may include, for example, oxide (e.g., $SiO_2$), but is not limited thereto.

Referring to FIGS. 6A to 6D, the mask layer 544 may be partially removed to form the mask layer 644, and the mask layer 644 may expose an upper surface of the preliminary intergate spacer 430. For example, an upper surface of the preliminary intergate spacer 430 adjacent to an upper portion of the preliminary stack structure 332 (e.g., an upper stack) may be exposed from the mask layer 644.

As shown in FIGS. 7A to 7D, the preliminary intergate spacer 430 may be partially removed to form the intergate spacer 130. For example, an upper portion of the preliminary intergate spacer 430 may be removed to expose an upper portion of the dummy gate insulator 342, thereby forming the intergate spacer 130. An upper surface of the intergate spacer 130 may be farther than an upper surface of an uppermost lower sacrificial layer 338, an upper surface of the integrated sacrificial layer 318, and a lower surface of a lowermost upper sacrificial layer 340 from the substrate 120 in the vertical direction. However, embodiments of the present inventive concept are not limited to thereto. Then, as shown in FIGS. 8A to 8D, the mask layer 644 may be removed.

As shown in FIGS. 9A to 9D, a dummy gate structure 946 may be formed on the substrate 120. The dummy gate structure 946 may be formed on the preliminary stack structure 332. For example, the dummy gate structure 946 may traverse the upper channel layers 336 in the Y-direction. The dummy gate structure 946 may include a dummy gate insulator 942 formed from the dummy gate insulator 342 on the upper channel layers 336 by an etching process, a dummy gate layer 948 on the dummy gate insulator 942, and a dummy gate mask 950 on the dummy gate layer 948. For example, the dummy gate insulator 942 may include oxide (e.g., $SiO_2$), the dummy gate layer 948 may include silicon (e.g., Si), and the dummy gate mask 950 may include silicon nitride (e.g., SiN). In some embodiments, the dummy gate insulator 942 may expose at least a portion of an upper surface of the uppermost upper channel layer 336.

As shown in FIGS. 10A to 10D, the integrated sacrificial layer 318 may be removed to form an integrated insulator opening 1018. The integrated sacrificial layer 318 may be removed by etch process(es) (e.g., a wet etch process and/or a dry etch process).

As shown in FIGS. 11A to 11D, a preliminary gate spacer layer 1126 may be formed on the preliminary stack structure 332, on the dummy gate structure 946, and in the integrated insulator opening 1018. The preliminary gate spacer layer 1126 may be conformally formed on a top surface and side surfaces of the dummy gate structure 946 (e.g., dummy gate insulator 942, dummy gate layer 948, and dummy gate mask 950). A portion of the preliminary gate spacer layer 1126 formed in the integrated insulator opening 1018 may form the integrated insulator 118. For example, the preliminary gate spacer layer 1126 may fill the integrated insulator opening 1018 to form the integrated insulator 118. In some embodiments, the integrated insulator 118 may include multiple layers having different materials. The preliminary gate spacer layer 1126 may include, for example, silicon-boron carbonitride (SiBCN) and/or silicon oxycarbonitride (SiOCN).

As shown in FIGS. 12A to 12D, an etch process may be performed on the preliminary stack structure 332 using the dummy gate structures 946 and the preliminary gate spacer layers 1126 formed on side surfaces of the dummy gate structures 946 as an etch mask, thereby forming upper channel regions 108, lower channel regions 106 and an integrated insulator 118. The etch process may etch a portion (e.g., an upper portion) of the preliminary gate spacer layers 1126 to form preliminary gate spacers 1226. For example, an upper portion of the preliminary gate spacer 1226 may have smaller width in X-direction and/or Y-direction than that of a lower portion of the preliminary gate spacer 1226. The etch process may be a single process or multiple processes. The upper channel region 108 may be a portion of the upper channel layer 336, and the lower channel region 106 may be a portion of the lower channel layer 334. Further, a plurality of upper sacrificial patterns 1140 may be formed from the upper sacrificial layers 340, and a plurality of lower sacrificial patterns 1138 may be formed from the lower sacrificial layers 338.

In addition, the upper inner spacer layer 134 may be formed on side surfaces of the upper sacrificial patterns 1140, and the lower inner spacer layer 132 may be formed on side surfaces of the lower sacrificial patterns 1138. In some embodiments, portions of the upper sacrificial patterns 1140 and the lower sacrificial patterns 1138 may be removed to form recesses on the side surfaces of the upper sacrificial patterns 1140 and on the side surfaces of the lower sacrificial patterns 1138 and then the upper inner spacer layer 134 and the lower inner spacer layer 132 may be formed in those recesses, respectively. The upper inner spacer layer 134 and the lower inner spacer layer 132 may include a same material (e.g., SiN).

In some embodiments, the lower source/drain regions 114 and upper source/drain regions 116 may be formed. The lower source/drain regions 114 may be formed on side surfaces of the lower channel regions 106, respectively. For example, the lower source/drain regions 114 may be epitaxially grown from the lower channel regions 106. In some embodiments, the lower channel regions 106 may include silicon (Si), and the lower source/drain regions 114 may include silicon, silicon carbide, or silicon germanium.

Likewise, upper source/drain regions 116 may be formed on side surfaces of the upper channel regions 108, respectively. For example, the upper source/drain regions 116 may be epitaxially grown from the upper channel regions 108. In some embodiments, the upper channel regions 108 may include silicon (Si), and the upper source/drain regions 116 may include silicon, silicon carbide, or silicon germanium. An insulating layer 1252 may be formed on the lower source/drain regions 114 and the upper source/drain regions 116.

The methods may include forming a lower gate structure and an upper gate structure (e.g., the lower gate structure 110 and the upper gate structure 112). As shown in FIGS. 13A to 13D, the dummy gate structures 946 may be removed by an etching process. In some embodiments, a first cavity (also referred to as a first opening) 1354 may be formed between the lower channel regions 106 and the intergate spacer 130 by removing the dummy gate structures 946. In some embodiments, a second cavity (also referred to as a second opening) 1356 may be formed between the intergate spacer 130 and the gate spacer 126. For example, the intergate spacer 130 may be spaced apart from the lower channel regions 106 and/or the gate spacer 126. In some embodiments, the intergate spacer 130 may be spaced apart from the lower channel regions 106 and in contact with the gate spacer 126 (referring to first sub-intergate spacer 1830a in FIGS. 18A and 18B). A portion of the preliminary gate spacer 1226 (e.g., an upper portion of the preliminary gate spacer 1226) may be removed by an etching process to form the gate spacer 126. The upper sacrificial patterns 1140 and the lower sacrificial patterns 1138 may be removed by an etch process. In some embodiments, a gate insulator (not shown in FIGS. 13A to 13D) having a uniform thickness may be formed along those exposed surfaces and may contact those exposed surfaces. For example, the gate insulator may be formed on exposed surfaces of the lower channel regions 106 and the upper channel regions 108.

As shown in FIGS. 14A to 14D, a preliminary lower work function layer 1422 may be formed on the lower channel regions 106, upper channel regions 108, and intergate spacer 130. In some embodiments, the preliminary lower work function layer 1422 may be formed in the first cavity 1354 and/or the second cavity 1356. For example, the preliminary lower work function layer 1422 may at least partially fill the first cavity 1354 and/or the second cavity 1356.

As shown in FIGS. 15A to 15D, an upper portion of the preliminary lower work function layer 1422 may be removed by an etching process to form the lower work function layer 122. The lower work function layer 122 may be disposed on the lower channel regions 106 and the intergate spacer 130 (e.g., a side surface of the intergate spacer 130).

A vertical portion of the lower work function layer 122 having a relatively thick thickness may be formed because of the intergate spacer 130. Accordingly, recess (e.g., pinch-off) of the lower work function layer 122 between the lower channel regions 106 may not be formed while removing the upper portion of the preliminary lower work function layer 1422. In some embodiments, an upper surface (and an upper portion of a side surface) of the intergate spacer 130 may be exposed from the lower work function layer 122.

As shown in FIGS. 16A to 16D the upper work function layer 124 may be formed on the upper channel regions 108, intergate spacer 130 (e.g., upper surface and/or an upper portion of the intergate spacer 130), and the lower work function layer 122 (e.g., an upper surface of the lower work function layer 122). Referring back to FIGS. 1A to 1D, the gate layer 128 may be formed on the upper work function layer 124 and the upper channel regions 108.

In some embodiments, an upper surface of the intergate spacer 130 may be farther than an upper surface of an uppermost lower work function layer 122, an upper surface of the integrated insulator 118, and a lower surface of a lowermost upper work function layer 124 from the substrate 120 in the vertical direction. In some embodiments, a lower surface of the upper channel region 108 (e.g., a lower surface of the lowermost upper channel region 108) may be closer than an upper surface of the intergate spacer 130 to the substrate 120.

FIGS. 17A and 17B are cross-sectional views of an integrated circuit device 170 according to some embodiments. As shown in FIGS. 17A and 17B, the gate layer 1728 (corresponding to the gate layer 128 in FIGS. 1A to 1D) may comprise a lower gate layer 1728a and an upper gate layer 1728b. The lower gate layer 1728a may be formed on the intergate spacer 130. The intergate spacer 130 may be between the lower work function layer 1722 and the lower gate layer 1728a. In some embodiments, an upper surface of the lower work function layer 1722 and an upper surface of the lower gate layer 1728a may be at the same distance (e.g., same height) from the substrate 120, as illustrated in FIGS. 17A and 17B. The upper work function layer 1724 may be formed on the lower work function layer 1722, the lower gate layer 1728a, and/or the intergate spacer 130. The upper work function layer 1724 may contact the lower work function layer 1722 (e.g., an upper surface of the lower work function layer 1722) and the lower gate layer 1728a (e.g., an upper surface of the lower gate layer 1728a). The upper gate layer 1728b may be formed on the upper work function layer 1724.

FIGS. 18A and 18B are cross-sectional views of an integrated circuit device 180 according to some embodiments. The integrated circuit device 180 is similar to the integrated circuit device 100 in FIGS. 1A, to 1D. The integrated circuit device 180 may be different from the integrated circuit device 100, in that an intergate spacer 1830 (corresponding to the intergate spacer 130 in FIGS. 1A to 1D) may comprise multiple layers. For example, the inter-gate spacer 1830 may include a first sub-intergate spacer 1830a and a second sub-intergate spacer 1830b. In some embodiment, the first sub-intergate spacer 1830a may be disposed on the second sub-intergate spacer 1830b. In some embodiments, the first sub-intergate spacer 1830a and the second sub-intergate spacer 1830b may be in contact with the gate spacer 1826 and the lower work function layer 1822. In some embodiments, the first sub-intergate spacer 1830a and the second sub-intergate spacer 1830b may have different materials. For example, the first sub-intergate spacer 1830a may include an insulating material, such as silicon nitride (e.g., SiN), and the second sub-intergate spacer 1830b may include a semiconductor material, such as poly-silicon. However, the embodiments of the structure, material, and location of the intergate spacer 1830 (corresponding to the intergate spacer 130 in FIGS. 1A to 1D) may not be limited thereto.

FIGS. 19 through 22 are cross-sectional views illustrating methods of forming the integrated circuit device 180 in FIGS. 18A and 18B according to some embodiments. The methods of manufacturing the integrated circuit device 180 may include similar methods described with reference to FIGS. 3A, 3B, 3C, and 3D through 16A, 16B, 16C, and 16D. FIGS. 19, 20, 21, and 22 may correspond to FIGS. 3A, 9A, 12A, and 13A, respectively.

Example embodiments are described herein with reference to the accompanying drawings. Many different forms and embodiments are possible without deviating from the teachings of this disclosure and so the disclosure should not be construed as limited to the example embodiments set forth herein. Rather, these example embodiments are provided so that this disclosure will be thorough and complete, and will convey the scope of the present invention to those skilled in the art. In the drawings, the sizes and relative sizes of layers and regions may be exaggerated for clarity. Like reference numbers refer to like elements throughout.

Example embodiments are described herein with reference to cross-sectional illustrations that are schematic illustrations of idealized embodiments and intermediate structures of example embodiments. As such, variations from the shapes of the illustrations as a result, for example, of manufacturing techniques and/or tolerances, are to be expected. Thus, embodiments herein should not be construed as limited to the particular shapes illustrated herein but may include deviations in shapes that result, for example, from manufacturing.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including." when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled." "connected," or "responsive" to, or "on," another element, it can be directly coupled, connected, or responsive to, or on, the other element, or intervening elements may also be present. In contrast, when an element is referred to as being "directly coupled." "directly connected." or "directly responsive" to, or "directly on," another element, there are no intervening elements present. As used herein, the term "and/or" includes any and all combinations of one or more of the associated listed items. Moreover, the symbol "/" (e.g., when used in the term "source/drain") will be understood to be equivalent to the term "and/or."

It will be understood that although the terms "first," "second," etc. may be used herein to describe various elements, these elements should not be limited by these terms. These terms are only used to distinguish one element from another. Thus, a first element could be termed a second element without departing from the teachings of the present embodiments.

Spatially relative terms, such as "beneath," "below," "lower," "above." "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if a device in the figures is turned over, elements described as "below" or "beneath" other elements or features would then be oriented "above" the other elements or features. Thus, the term "below" can encompass both an orientation of above and below. The device may be otherwise oriented (e.g., rotated 90 degrees or at other orientations) and the spatially relative descriptors used herein may be interpreted accordingly.

In one example, when a certain embodiment may be implemented differently, processes or methods may occur in a sequence different from that specified in the description herein. For example, two consecutive processes may actually be executed at the same time. Depending on a related function or operation, the processes may be executed in a reverse sequence. Moreover, a process may be separated into multiple processes and/or may be at least partially integrated.

In descriptions of temporal relationships, for example, temporal precedent relationships between two events such as "after", "subsequent to", "before", etc., another event may occur therebetween unless "directly after", "directly subsequent" or "directly before" is not indicated.

"An integrated unitary structure" herein may mean a structure formed by the same process or the same series of processes without a structurally or visibly separated sub-part therein.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

The above-disclosed subject matter is to be considered illustrative, and not restrictive, and the appended claims are intended to cover all such modifications, enhancements, and other embodiments, which fall within the scope of the present invention. Thus, to the maximum extent allowed by law, the scope is to be determined by the broadest permissible interpretation of the following claims and their equivalents, and shall not be restricted or limited by the foregoing detailed description.

14

What is claimed is:

1. An integrated circuit device comprising:
an upper transistor on a substrate, the upper transistor comprising an upper channel region;
a lower transistor between the substrate and the upper transistor, the lower transistor comprising a lower channel region;
an intergate spacer comprising an insulating material and adjacent to a side surface of the lower channel region; and
a gate layer, wherein the intergate spacer is between the side surface of the lower channel region and the gate layer,
wherein a lower surface of the upper channel region is closer than an upper surface of the intergate spacer to the substrate.

2. The integrated circuit device of claim 1, wherein the lower transistor further comprises a lower work function layer on the lower channel region, and
the intergate spacer extends between the lower work function layer and the gate layer.

3. The integrated circuit device of claim 2, wherein the intergate spacer comprises opposing side surfaces that contact the lower work function layer and the gate layer, respectively.

4. The integrated circuit device of claim 1, wherein the lower transistor further comprises a lower work function layer on the lower channel region, and the upper transistor further comprises an upper work function layer on the upper channel region, and
the intergate spacer extends between the lower work function layer and the upper work function layer.

5. The integrated circuit device of claim 4, wherein the intergate spacer comprises opposing side surfaces that contact the lower work function layer and the upper work function layer, respectively.

6. The integrated circuit device of claim 1, further comprising an intergate insulator between the lower channel region and the upper channel region,
wherein an upper surface of the intergate insulator is closer than an upper surface of the intergate spacer to the substrate.

7. The integrated circuit device of claim 1, wherein the lower channel region comprises two lower channel regions spaced apart from each other by a first distance in a vertical direction,
the upper channel region comprises two upper channel regions spaced apart from each other by a second distance in the vertical direction, and
the second distance is longer than the first distance.

8. The integrated circuit device of claim 7, wherein the intergate spacer is spaced apart from the lower channel region by a third distance in a horizontal direction, and
the third distance is at least equal to the first distance.

9. The integrated circuit device of claim 1, wherein the upper channel region and the lower channel region have different conductivity types.

10. An integrated circuit device comprising:
an upper transistor on a substrate, the upper transistor comprising an upper channel region;
a lower transistor between the substrate and the upper transistor, the lower transistor comprising a lower channel region and a lower work function layer on the lower channel region;
an intergate spacer comprising an insulating material, wherein the lower work function layer is between the lower channel region and the intergate spacer; and

15 a gate layer on the intergate spacer, wherein a lower surface of the upper channel region is closer than an upper surface of the intergate spacer to the substrate.

11. The integrated circuit device of claim 10, wherein an upper surface of the lower work function layer is closer than an upper surface of the intergate spacer to the substrate.

12. The integrated circuit device of claim 10, wherein the lower work function layer contacts both the lower channel region and the intergate spacer.

13. The integrated circuit device of claim 10, wherein the lower channel region comprises two lower channel regions spaced apart from each other by a first distance in a vertical direction, the upper channel region comprises two upper channel regions spaced apart from each other by a second distance in the vertical direction, and the second distance is longer than the first distance.

14. The integrated circuit device of claim 13, wherein the intergate spacer is spaced apart from the lower channel region by a third distance in a horizontal direction, and the third distance is at least equal to the first distance.

15. A method of forming an integrated circuit device, the method comprising:

forming a lower stack and an upper stack on a substrate, wherein the lower stack is between the substrate and the upper stack, the lower stack comprises a lower sacrificial pattern and a lower channel region stacked in a vertical direction, and the upper stack comprises an upper sacrificial pattern and an upper channel region stacked in the vertical direction;

forming a dummy gate insulator on the lower stack and the upper stack;

16 forming an intergate spacer adjacent to a side surface of the lower stack;

removing the dummy gate insulator, the lower sacrificial pattern and the upper sacrificial pattern, thereby exposing the lower channel region and the upper channel region and forming a cavity between the lower channel region and the intergate spacer;

forming a gate insulator on the lower channel region and the upper channel region;

forming a lower work function layer on the gate insulator and in the cavity between the lower channel region and the intergate spacer;

forming an upper work function layer on the lower work function layer and the intergate spacer; and forming an upper gate layer on the upper work function layer.

16. The method of claim 15, wherein forming the intergate spacer comprises:

forming a preliminary intergate spacer layer on the dummy gate insulator, the preliminary intergate spacer layer contacting the dummy gate insulator;

etching the preliminary intergate spacer layer, thereby forming a preliminary intergate spacer; and removing an upper portion of the preliminary intergate spacer to expose an upper portion of the dummy gate insulator, thereby forming the intergate spacer.

17. The method of claim 15, wherein an upper surface of the lower channel region is closer than an upper surface of the intergate spacer to the substrate.

18. The method of claim 15, wherein a lower surface of the upper channel region is closer than an upper surface of the intergate spacer to the substrate.

* * * * *